(12) United States Patent
Nakajima

(10) Patent No.: US 8,912,655 B2
(45) Date of Patent: Dec. 16, 2014

(54) SEMICONDUCTOR MEMORY DEVICE, METHOD OF MANUFACTURING THE SAME AND METHOD OF FORMING CONTACT STRUCTURE

(75) Inventor: Shingo Nakajima, Yokkaichi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 65 days.

(21) Appl. No.: 13/425,530

(22) Filed: Mar. 21, 2012

(65) Prior Publication Data

US 2012/0299189 A1 Nov. 29, 2012

(30) Foreign Application Priority Data

May 27, 2011 (JP) ................ P2011-119226

(51) Int. Cl.
*H01L 23/52* (2006.01)
*H01L 23/48* (2006.01)
*H01L 29/40* (2006.01)
*H01L 23/522* (2006.01)
*H01L 21/768* (2006.01)
*H01L 45/00* (2006.01)
*H01L 27/105* (2006.01)
*H01L 27/24* (2006.01)

(52) U.S. Cl.
CPC ...... *H01L 23/5226* (2013.01); *H01L 21/76895* (2013.01); *H01L 21/76897* (2013.01); *H01L 45/04* (2013.01); *H01L 45/1233* (2013.01); *H01L 27/105* (2013.01); *H01L 45/16* (2013.01); *H01L 45/1675* (2013.01); *H01L 27/2463* (2013.01); *H01L 27/2481* (2013.01)
USPC ............ 257/758; 257/775; 257/776; 257/211

(58) Field of Classification Search
CPC .................................. H01L 21/8229

USPC ............... 257/2–5, 45, 211, 758, 775, 776
See application file for complete search history.

(56) References Cited

U.S. PATENT DOCUMENTS 6,441,494 B2 * 8/2002 Huang et al. ............. 257/774
7,821,058 B2 * 10/2010 Kidoh et al. ............. 257/324

(Continued)

FOREIGN PATENT DOCUMENTS

JP 2007-43156 2/2007
JP 2011-071207 4/2011

OTHER PUBLICATIONS

Office Action mailed Apr. 22, 2014, in Japanese Patent Application No. 2011-119226, filed May 27, 2011 (with English-language translation).

*Primary Examiner* — David Zarneke
(74) *Attorney, Agent, or Firm* — Oblon, Spivak, McClelland, Maier & Neustadt, L.L.P.

(57) ABSTRACT

When a first wiring and/or a second wiring is formed, a connection portion is formed in the first wiring and/or the second wiring which covers a part of a lower electrode layer outside the memory cell array. An etching suppressing portion is formed above the connection portion. A contact hole is formed in which a portion under the etching suppressing portion reaches up to a connection potion, and the other portion reaches up to the lower electrode layer by performing etching to a laminated body in a range including the etching suppressing portion. The laminated body includes the insulating layer, the first wiring, a memory cell layer, the second wiring, and the etching suppressing portion. The contact layer is formed by burying a conductive material in the contact hole.

7 Claims, 33 Drawing Sheets

(56) References Cited

U.S. PATENT DOCUMENTS

| | | | |
|---|---|---|---|
| 8,207,613 B2* | 6/2012 | Okukawa et al. | 257/773 |
| 8,222,677 B2* | 7/2012 | Baba et al. | 257/211 |
| 8,227,897 B2* | 7/2012 | Kim | 257/536 |
| 8,274,068 B2* | 9/2012 | Nagashima | 257/5 |
| 8,441,040 B2* | 5/2013 | Minemura et al. | 257/210 |
| 8,471,297 B2* | 6/2013 | Murata | 257/211 |
| 8,482,049 B2* | 7/2013 | Son et al. | 257/314 |
| 8,513,778 B2* | 8/2013 | Tokitoh | 257/621 |
| 8,644,072 B2* | 2/2014 | Nagashima | 365/185.11 |
| 8,648,217 B2* | 2/2014 | Navarrini et al. | 568/615 |
| 8,648,467 B2* | 2/2014 | Baba | 257/758 |
| 8,648,471 B2* | 2/2014 | Tabata et al. | 257/774 |
| 8,649,202 B2* | 2/2014 | Sakaguchi et al. | 365/148 |
| 8,791,446 B2* | 7/2014 | Ishibashi | 257/4 |
| 2001/0029100 A1* | 10/2001 | Huang et al. | 438/638 |
| 2010/0032725 A1* | 2/2010 | Baba et al. | 257/211 |
| 2010/0237512 A1* | 9/2010 | Okukawa et al. | 257/786 |
| 2011/0122676 A1* | 5/2011 | Murooka et al. | 365/148 |
| 2011/0233505 A1* | 9/2011 | Nitta | 257/3 |
| 2011/0287590 A1* | 11/2011 | Song et al. | 438/129 |
| 2012/0025386 A1* | 2/2012 | Murata | 257/770 |
| 2012/0064683 A1* | 3/2012 | Ishiduki et al. | 438/268 |
| 2012/0068145 A1* | 3/2012 | Matsuo | 257/4 |
| 2012/0299063 A1* | 11/2012 | Baba | 257/208 |
| 2013/0037860 A1* | 2/2013 | Jang | 257/211 |
| 2013/0099306 A1* | 4/2013 | Choi et al. | 257/329 |
| 2013/0163304 A1* | 6/2013 | Kim | 365/71 |
| 2013/0249113 A1* | 9/2013 | Baba | 257/776 |

* cited by examiner

FIG. 10
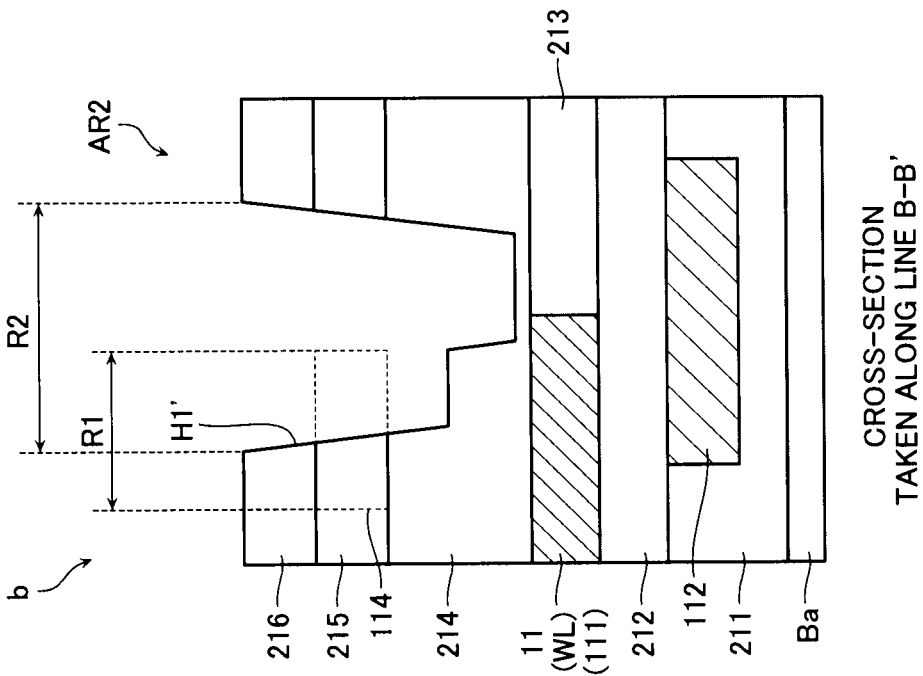
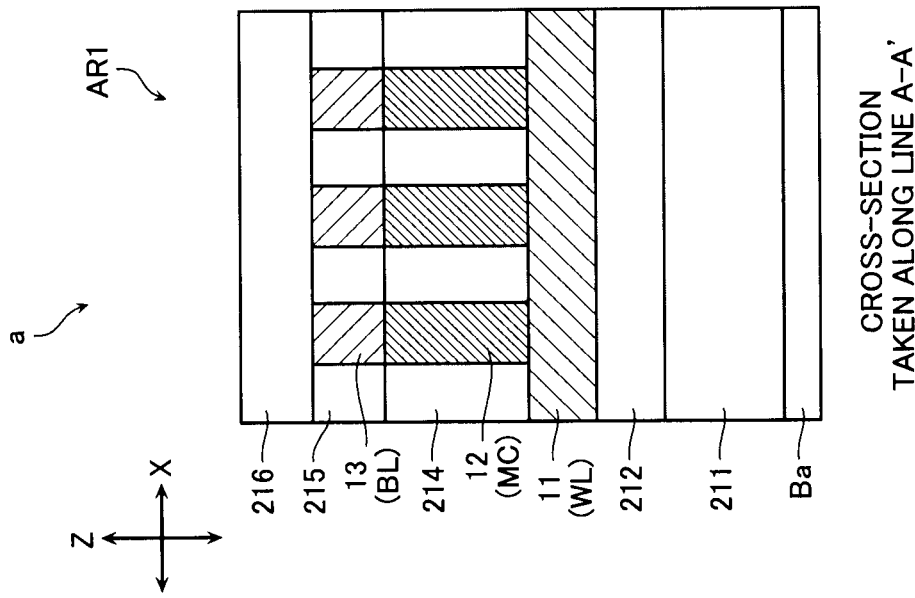

FIG. 11
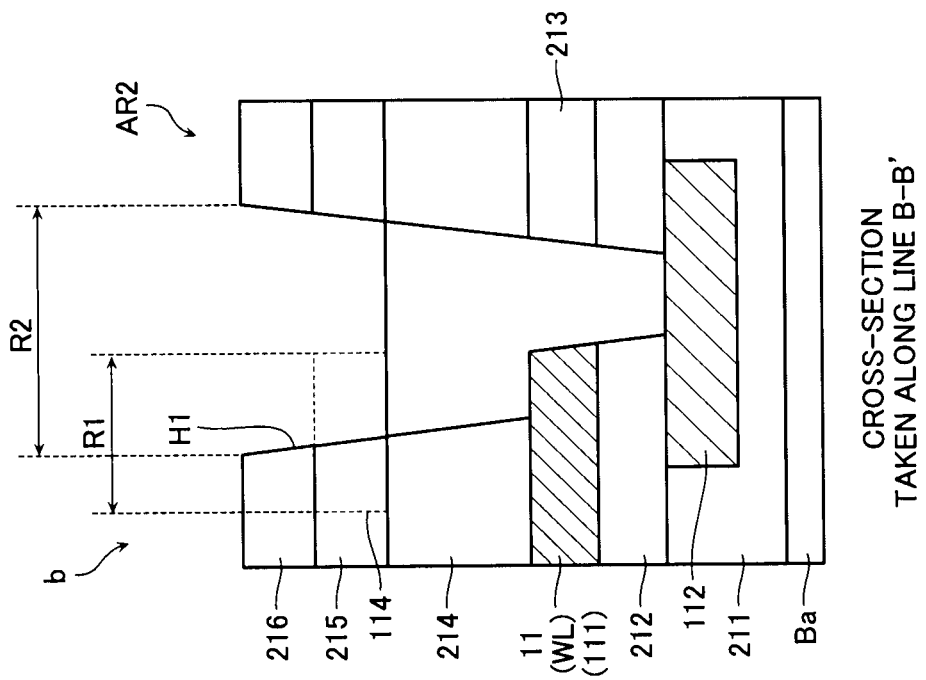
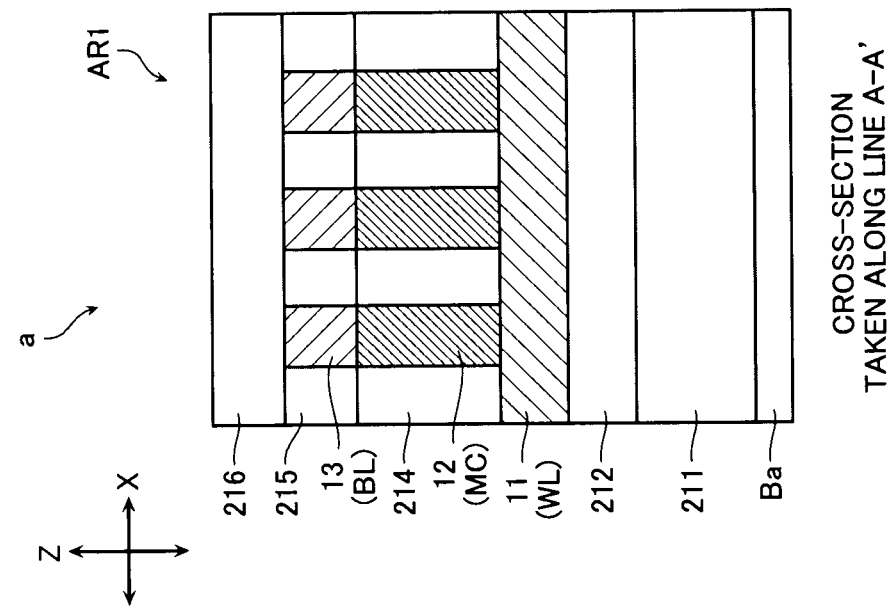

COMPARATIVE EXAMPLE

SEMICONDUCTOR MEMORY DEVICE, METHOD OF MANUFACTURING THE SAME AND METHOD OF FORMING CONTACT STRUCTURE

CROSS-REFERENCE TO RELATED APPLICATIONS

This application is based upon and claims the benefit of priority from the prior Japanese Patent Application No. 2011-119226, filed on May 27, 2011, the entire contents of which are incorporated herein by reference.

FIELD

Embodiments described here relate to a stacking-type semiconductor memory device in which wiring layers are stacked, a method of manufacturing the same and a method of forming a contact structure.

BACKGROUND

Recently, in order to increase the memory capacities of semiconductor memory devices, various semiconductor memory devices have been developed which have a structure of three-dimensional stacking layers. For example, as a non-volatile semiconductor memory device having a stacked cross-point structure as one of such a type of semiconductor memory device, a variable-resistance-type memory such as a ReRAM or a PRAM that can be electrically rewritable has attracted attention. Such a variable-resistance-type memory is acquired by connecting a variable-resistance memory cell between both wirings at intersections of two wirings extending in directions perpendicular to each other. Generally, in a lower layer beneath the variable-resistance-type memory and a wiring connected thereto, a control circuit that controls the memory and the like are arranged. In addition, a contact layer, which is used for connecting the control circuit and the wiring, extending in the stacking direction is provided. Since a current to be sensed flows through the contact layer, a low-resistance contact structure needs to be formed between the contact layer and the wiring.

BRIEF DESCRIPTION OF THE DRAWINGS

FIG. 10 shows cross-sectional views taken along lines A-A' and B-B' illustrated in FIG. 3 in the manufacturing process according to the first embodiment.

FIG. 11 shows cross-sectional views taken along lines A-A' and B-B' illustrated in FIG. 3 in the manufacturing process according to the first embodiment.

DETAILED DESCRIPTION

A method of manufacturing a semiconductor memory device according to an embodiment described below is a method of manufacturing a semiconductor memory device that includes: a lower circuit layer including a substrate and a lower electrode layer located on the substrate; an upper circuit layer including a first wiring formed above the lower circuit layer and extending in a predetermined direction, a second wiring being perpendicular to the first wiring, and a memory cell layer disposed between the first wiring and the second wiring; and a contact layer that connecting the lower electrode layers and at least one of the first wiring and the second wiring outside a cell array in which the memory cell layer is formed, and includes the following process. The lower electrode layer is formed in the lower circuit layer, and the first wiring is formed above the lower electrode layer through an insulating layer. The memory cell layer is formed on the first wiring within the cell array, and the second wiring is formed on the memory cell layer. When the first wiring and/or the second wiring is formed, a connection portion is formed, which covers a part of the lower electrode layer outside the memory cell array, in the first wiring and/or the second wiring. An etching suppressing portion is formed above the connection portion. A contact hole is formed in which a portion under the etching suppressing portion reaches up to the connection potion, and the other portion reaches up to the lower electrode layer by performing etching to a laminated body in a range including the etching suppressing portion. The laminated body includes the insulating layer, the first wiring, the memory cell layer, the second wiring, and the etching suppressing portion. Then, the contact layer is formed by burying a conductive material in the contact hole.

Hereinafter, semiconductor memory devices according to embodiments will be described with reference to the drawings.

[First Embodiment]
<Configuration>

Figure 1:
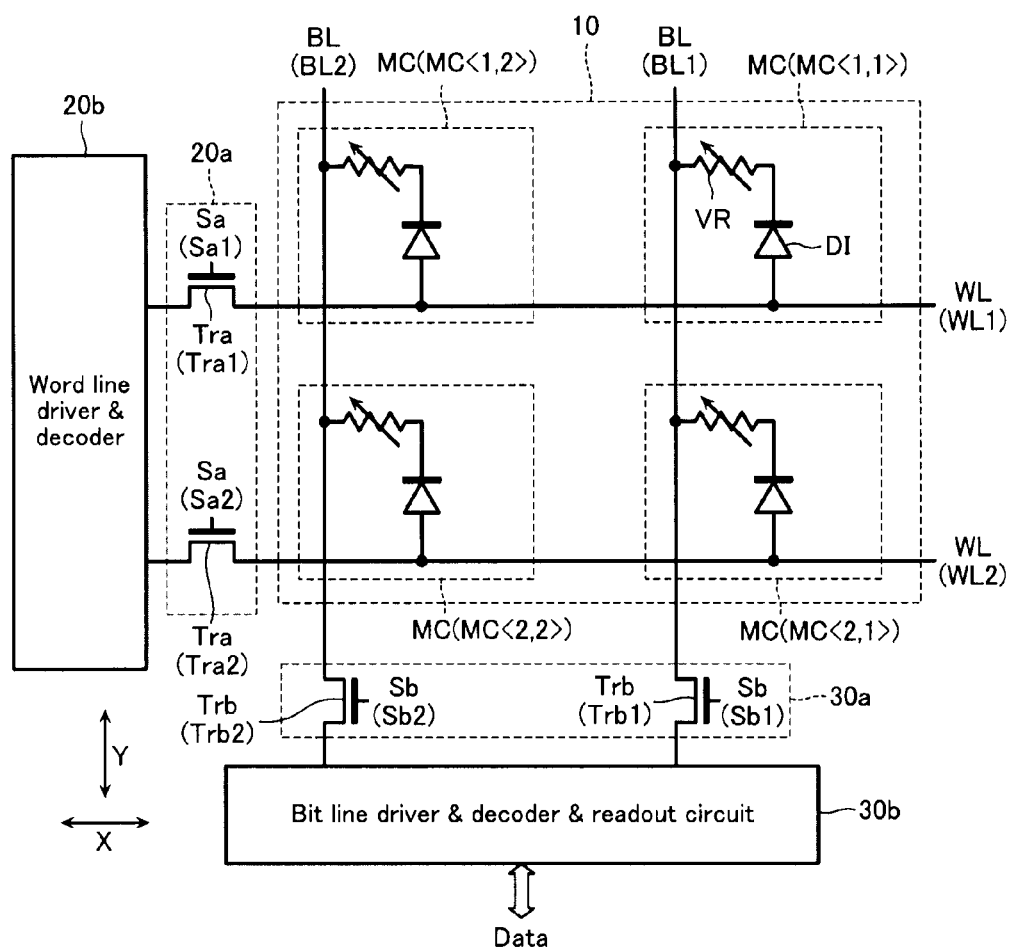
FIG. 1 shows a block diagram of a semiconductor memory device according to a first embodiment.

First, the circuit configuration of a semiconductor memory device according to a first embodiment will be described. FIG. 1 shows a circuit diagram of the semiconductor memory device according to the first embodiment.

The semiconductor memory device according to the first embodiment is a variable-resistance-type memory and, as illustrated in FIG. 1, includes: a memory cell array 10 that includes variable-resistance elements VR; a word line selecting circuit 20a; a word line driving circuit 20b; a bit line selecting circuit 30a; and a bit line driving circuit 30b, which are used for operating the memory cell array 10.

The memory cell array 10, as illustrated in FIG. 1, includes: word lines WL (WL1 and WL2) as first wirings, bit lines BL (BL1 and BL2) as second wirings that intersect with the first wirings; and memory cells MC (MC<1,1>to MC<2,2>) that are arranged at the intersections of the word lines WL and the bit lines BL. The word lines WL are arranged in a Y direction at a predetermined pitch and are formed to extend in a X direction. The bit lines BL are arranged in the X direction at a predetermined pitch and are formed to extend in the Y direction. In other words, the memory cells MC are arranged in a matrix pattern on a plane that is parallel to the X direction and the Y direction.

In a case where the memory cell MC is a unipolar type in which the directions of currents at the time of setting data and at the time of resetting data are the same, as illustrated in FIG. 1, it is configured to include a diode DI and a variable resistance element VR that are connected in series. The diode DI is arranged so as to prevent the occurrence of a sneak current at the time of reading out/writing data. The variable resistance element VR stores data in a non-volatile manner based on a resistance value that is electrically rewritable. The anode of the diode DI is connected to the word line WL, and the cathode thereof is connected to one end of the variable resistance element VR. The other end of the variable resistance element VR is connected to the bit line BL.

Such a memory cell MC is selected by a word line selecting circuit 20a that is configured from a plurality of selection transistors Tra (Tra1 and Tra2), a word line driving circuit 20b, a bit line selecting circuit 30a that is configured from a plurality of selection transistors Trb (Trb1 and Trb2), and a bit line driving circuit 30b. Then, data is written into the selected memory cell MC, or data is read out from the selected memory cell MC.

Figure 2:
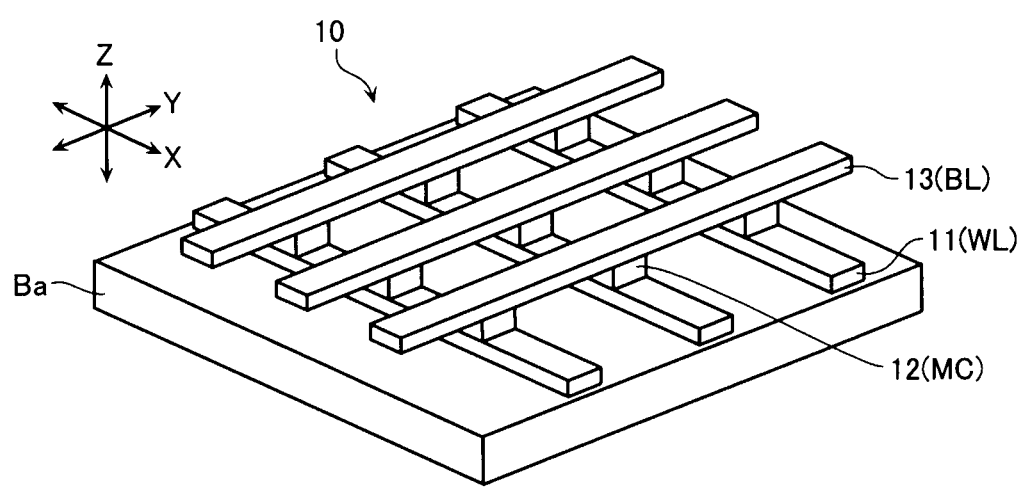
FIG. 2 shows a perspective view illustrating a memory cell array 10 according to the first embodiment.

The memory cell array 10, for example, as illustrated in FIG. 2, is configured as a so-called cross-point type. The memory cell array 10 is formed as an upper circuit layer on a lower circuit layer that includes a substrate Ba. On the substrate Ba, the word line selecting circuit 20a, the word line driving circuit 20b, the bit line selecting circuit 30a, the bit line driving circuit 30b, and the like, which have been described above, are formed. The upper circuit layer is acquired by stacking the first wirings 11 (the word lines WL), the memory cell layer 12, and the second wiring 13 (the bit lines BL) in the cross-point type. Materials having high thermal strength and low resistance values can be used preferably as the first wiring 11 and the second wiring 13. Such materials include, for example, the first wiring 11 and the second wiring 12 are configured by using titanium nitride (TiN), tungsten (W), tungsten silicide (WSi), nickel silicide (NiSi), cobalt silicide (CoSi), and the like. The memory cell layer 12, for example, is formed by using titanium dioxide ($TiO_2$), nickel oxide (NiO), metal oxide film (MeOx), hafnium oxide (HfOx), carbon or the like.

Figure 3:
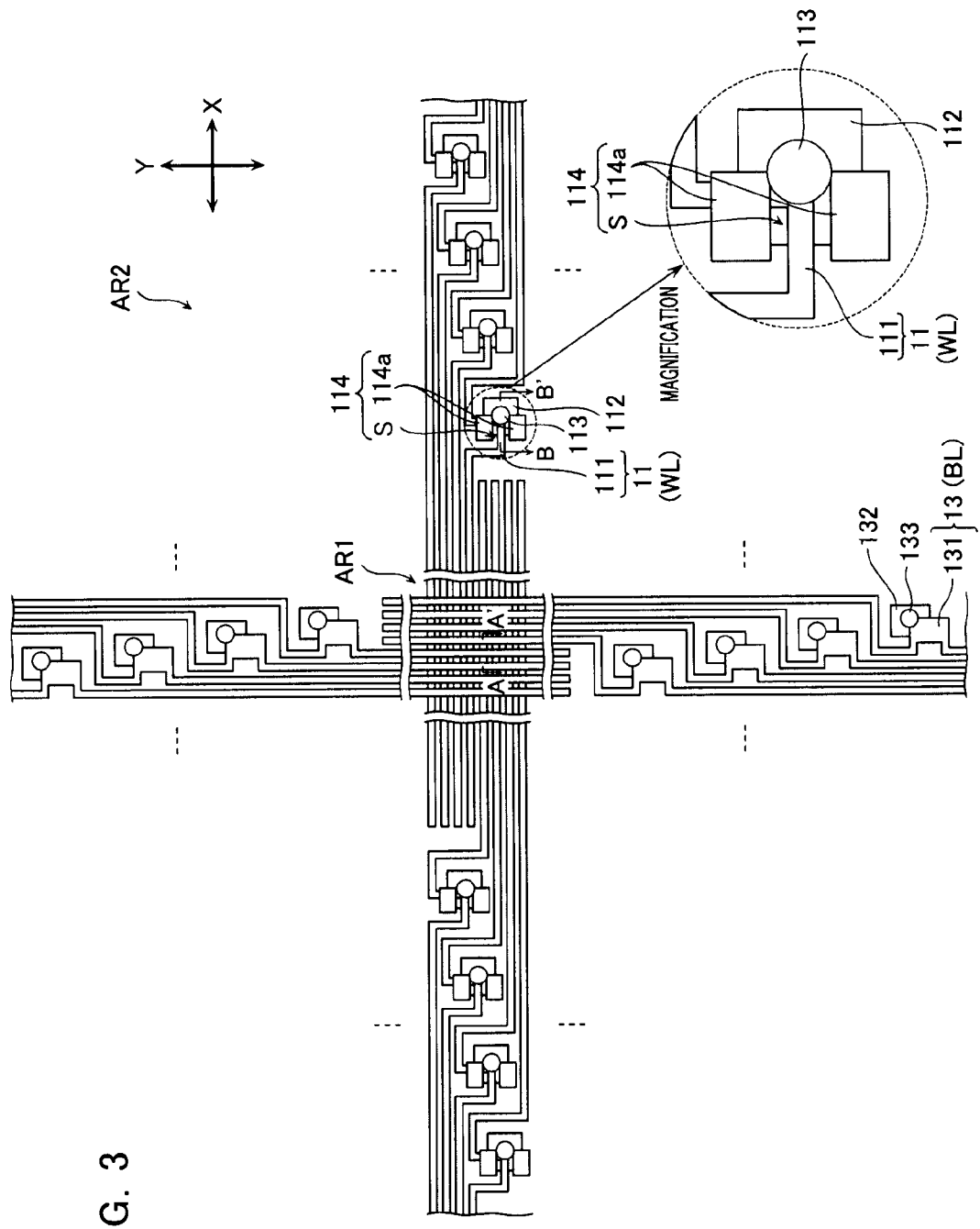
FIG. 3 shows a plan view of the semiconductor memory device according to the first embodiment.
Figure 4:
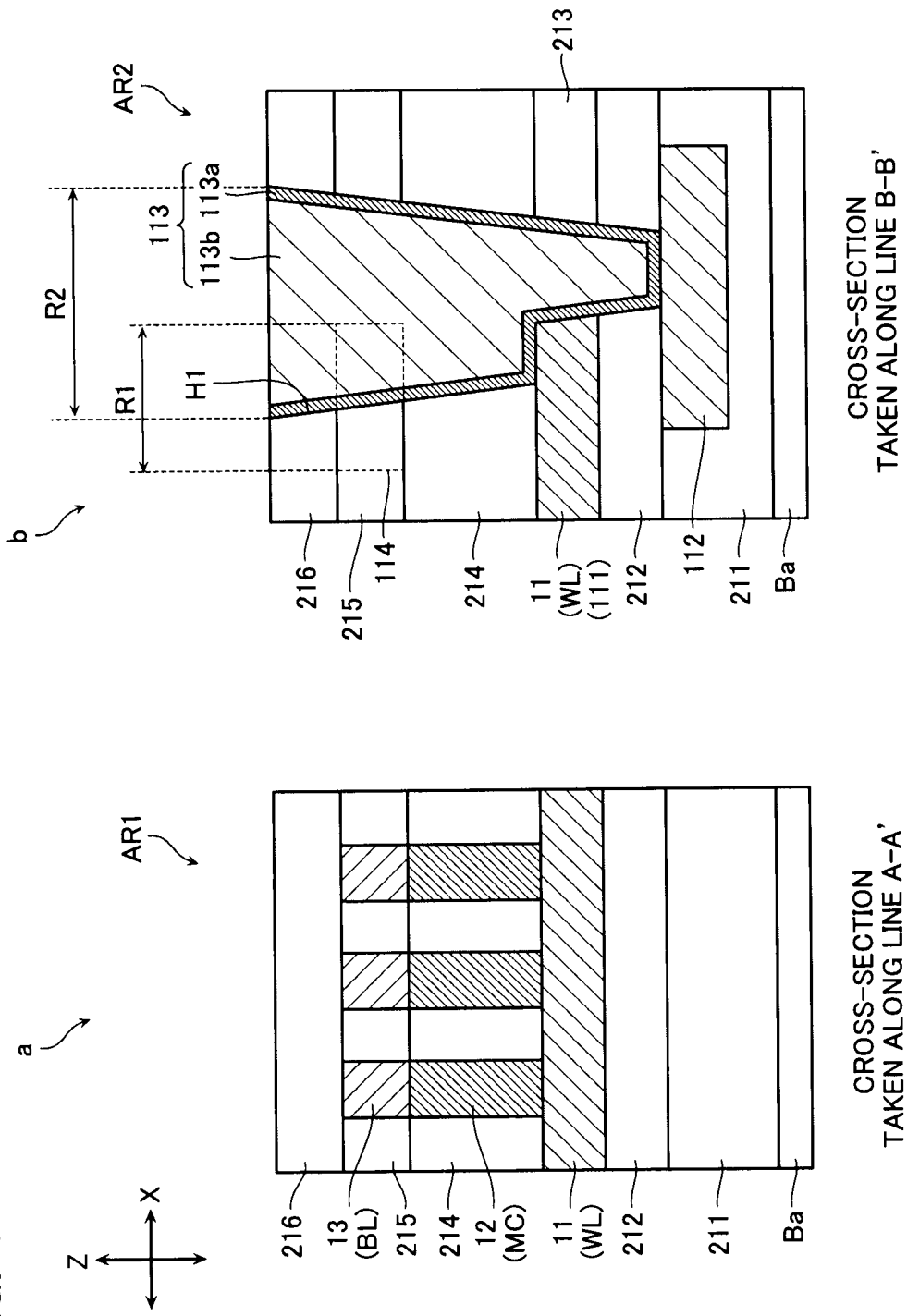
FIG. 4 shows cross-sectional views taken along lines A-A' and B-B' illustrated in FIG. 3.

Next, the stacking structure of the semiconductor memory device according to the first embodiment that includes the memory cell array 10 will be described with reference to FIGS. 3 and 4. FIG. 3 shows a plan view of the semiconductor memory device according to the first embodiment, and FIG. 4 shows cross-sectional views taken along lines A-A' and B-B' illustrated in FIG. 3, respectively.

The semiconductor memory device according to the first embodiment, as illustrated in FIG. 3, includes a memory region AR1 and a peripheral region AR2 that is arranged on the periphery thereof. The memory region AR1 is a region for forming a memory cell array 10. The peripheral region AR2 is a region that is disposed so as to electrically connect the first wiring 11 and the second wiring 13 extending from the memory cell array 10 to a control circuit (not illustrated in the figure) disposed in the lower circuit layer thereof. Where, the control circuit includes a circuit for controlling the memory cell array 10 such as the word line selecting circuit 20a, the word line driving circuit 20b, the bit line selecting circuit 30a, the bit line driving circuit 30b and the like described above.

As illustrated in FIG. 3, the first wiring (WL) 11 and the second wiring (BL) 13 are formed so as to extend over the memory region AR1 to the peripheral region AR2. In the peripheral region AR2, as illustrated in "b" of FIG. 4, a lower electrode layer 112 as a contact portion connected to the control circuit positioned within the substrate Ba is formed within an insulating layer 211 that is formed on the substrate Ba. The lower electrode layer 112 and the first wiring 11 formed thereon have a contact structure in which the lower electrode layer 112 and the first wiring 11 being connected to each other through a contact layer 113.

As illustrated in FIG. 3, the first wiring 11 includes a partially curved part as a connection portion 111 that is located above the lower electrode 112 so as to cover and overlap a part of the lower electrode 112 in the peripheral region AR2. The connection portion 111 is electrically connected to the lower electrode layer 112 located beneath the first wiring 11 through the contact layer 113. In addition, the width of the connection portion 111 is almost the same as that of the other portion of the first wiring 11.

The contact layer 113, as illustrated in "b" of FIG. 4, extends in the vertical direction toward the lower electrode layer 112 to be brought into contact with the side face and the upper face of the first wiring 11 (the connection portion 111) located beneath an etching suppressing portion 114 to be described later and the upper face of the lower electrode layer 112. In other words, the contact layer 113 is configured by a barrier metal layer 113a and a metal layer 113b having predetermined thicknesses filling a contact hole H1 that exposes the side face and the upper face of the first wiring 11 (the connection portion 111) and the lower electrode layer 112.

Above the connection portion 111 (in the same layer as that of the second wiring 13), as illustrated in FIGS. 3 and 4, the etching suppressing portion 114 is arranged. A region R1 in which the etching suppressing portion 114 is formed partly overlaps a region R2 in which the contact layer 113 is formed. The etching suppressing portion 114, as illustrated in FIG. 3, includes etching suppressing layers 114a that are formed through a slit S above both side of the connection portion 111 of the first wiring 11. This etching suppressing portion 114, as will be described in detail later, has a function of suppressing the etching process of the slit portion S more than the etching of the other portions. Accordingly, when interlayer insulating layers 212 to 216 are etched so as to form the contact hole H1, the etching suppressing portion 114 prevents the first wiring 11 (the connection portion 111) from being excessively removed. For example, in a case where the etching suppressing portion 114 is formed simultaneously with the second wiring 13, it is formed by using the same material as the material of the second wiring 13. Even in a case where the etching suppressing portion 114 is formed simultaneously with the second wiring 13, it is preferable that the etching suppressing portion 114 is not electrically connected to the second wiring 13.

The second wiring 13, as illustrated in FIG. 3, similarly to the first wiring 11, includes a curved connection portion 131 in the peripheral region AR2. The connection portion 131 is electrically connected to a lower electrode layer 132 located on the lower side (the same layer as the lower electrode layer 111) of the first wiring 11 through a contact layer 133. The width of the connection portion 131 is formed to be larger than the width of the other portions of the second wiring 13.

<Manufacturing Method>

Figure 5:
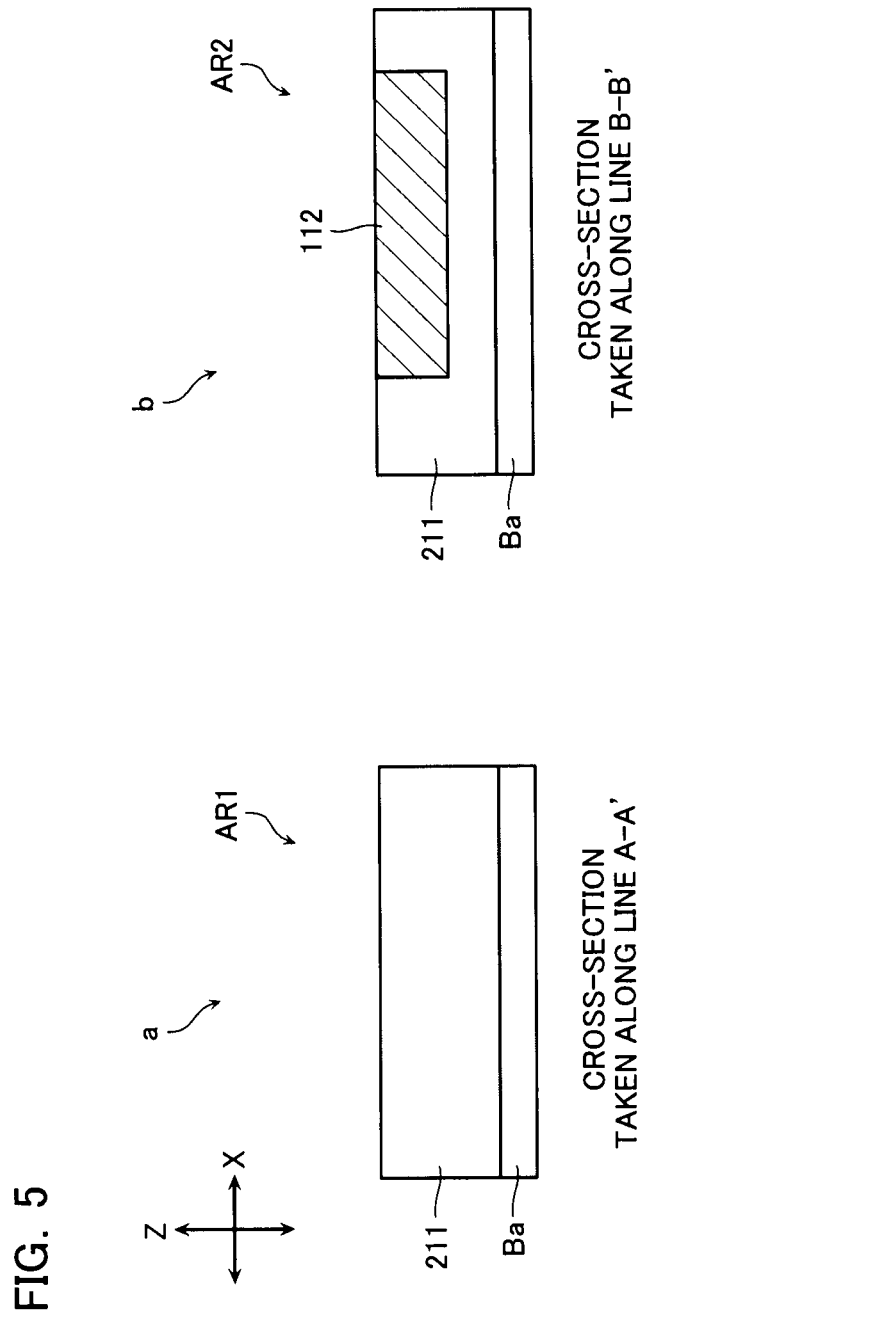
FIG. 5 shows cross-sectional views taken along lines A-A' and B-B' illustrated in FIG. 3 in a manufacturing process according to the first embodiment.

Next, a method of manufacturing the semiconductor memory device according to the first embodiment will be described with reference to FIGS. 5 to 11. FIGS. 5 to show cross-sectional views taken along lines A-A' and B-B' illustrated in FIG. 3, respectively, in the manufacturing process.

Figure 6:
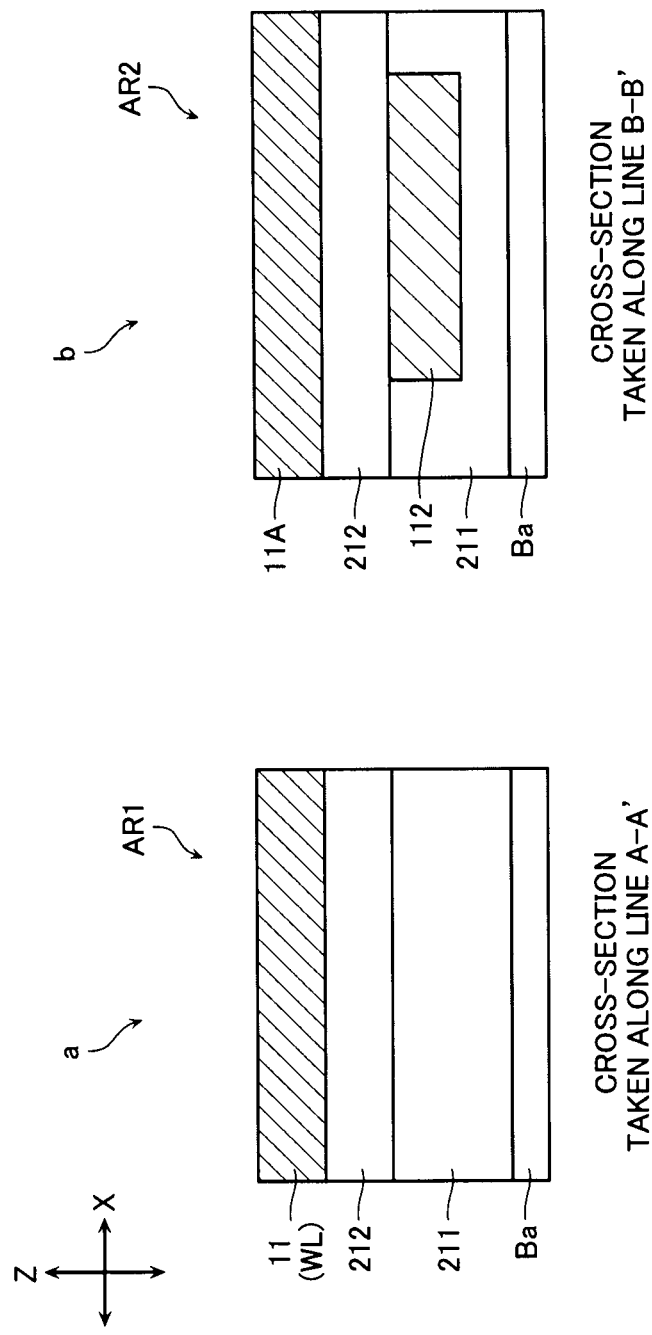
FIG. 6 shows cross-sectional views taken along lines A-A' and B-B' illustrated in FIG. 3 in the manufacturing process according to the first embodiment.
Figure 7:
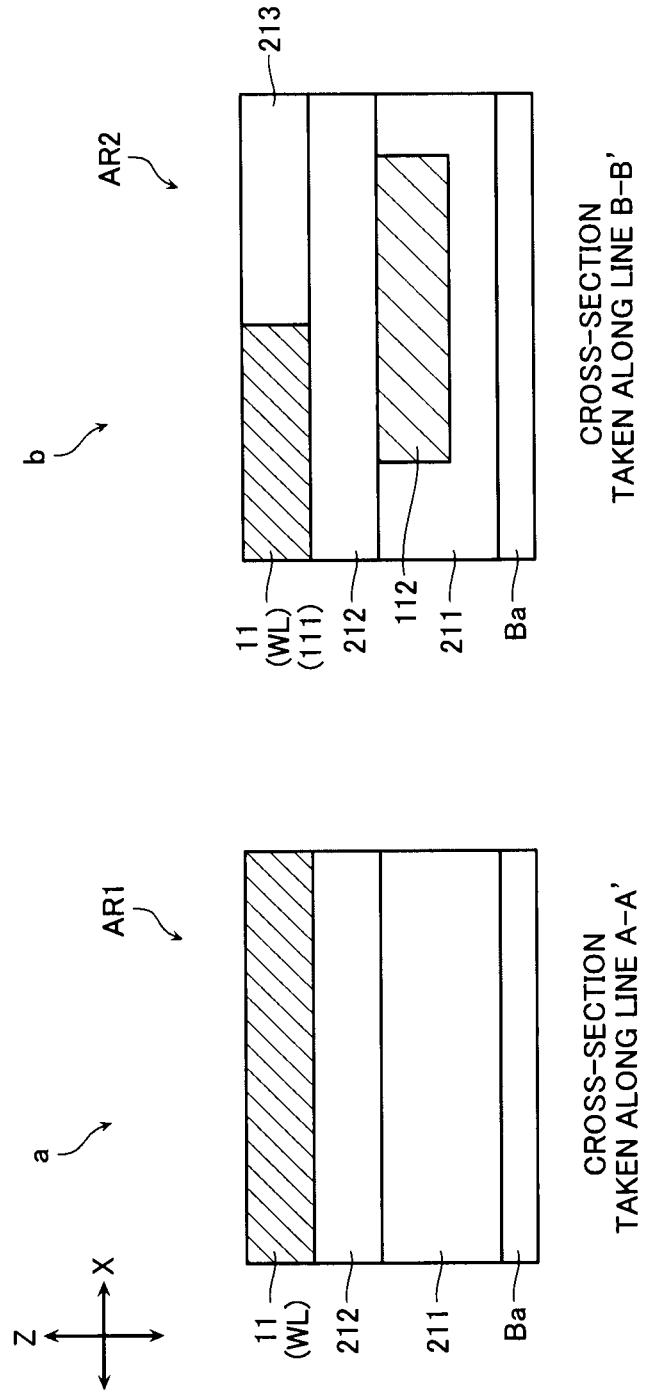
FIG. 7 shows cross-sectional views taken along lines A-A' and B-B' illustrated in FIG. 3 in the manufacturing process according to the first embodiment.

First, as illustrated in FIG. 5, in a peripheral region AR2, an insulating layer 211 is formed on a substrate Ba, and a lower electrode layer 112 is formed on the surface of the insulating layer 211. Next, as illustrated in FIG. 6, a first wiring layer 11A is formed on the insulating layer 211 through an interlayer insulating layer 212. Subsequently, a first wiring (the word line WL) 11 is formed by processing the first wiring layer 11A through an anisotropic reactive ion etching or the like, as illustrated in FIG. 7, and a gap between the first wiring layers 11 is filled with an interlayer insulating layer 213. Then, the surfaces of the first wiring 11 and the interlayer insulating layer 213 are flattened through chemical mechanical polishing (CMP). In the processing of the first wiring 11, for example, a side-wall transfer process is used. Accordingly, the pitch of the first wirings 11 can be formed finely up to ½ of the resist pattern or less.

Figure 8:
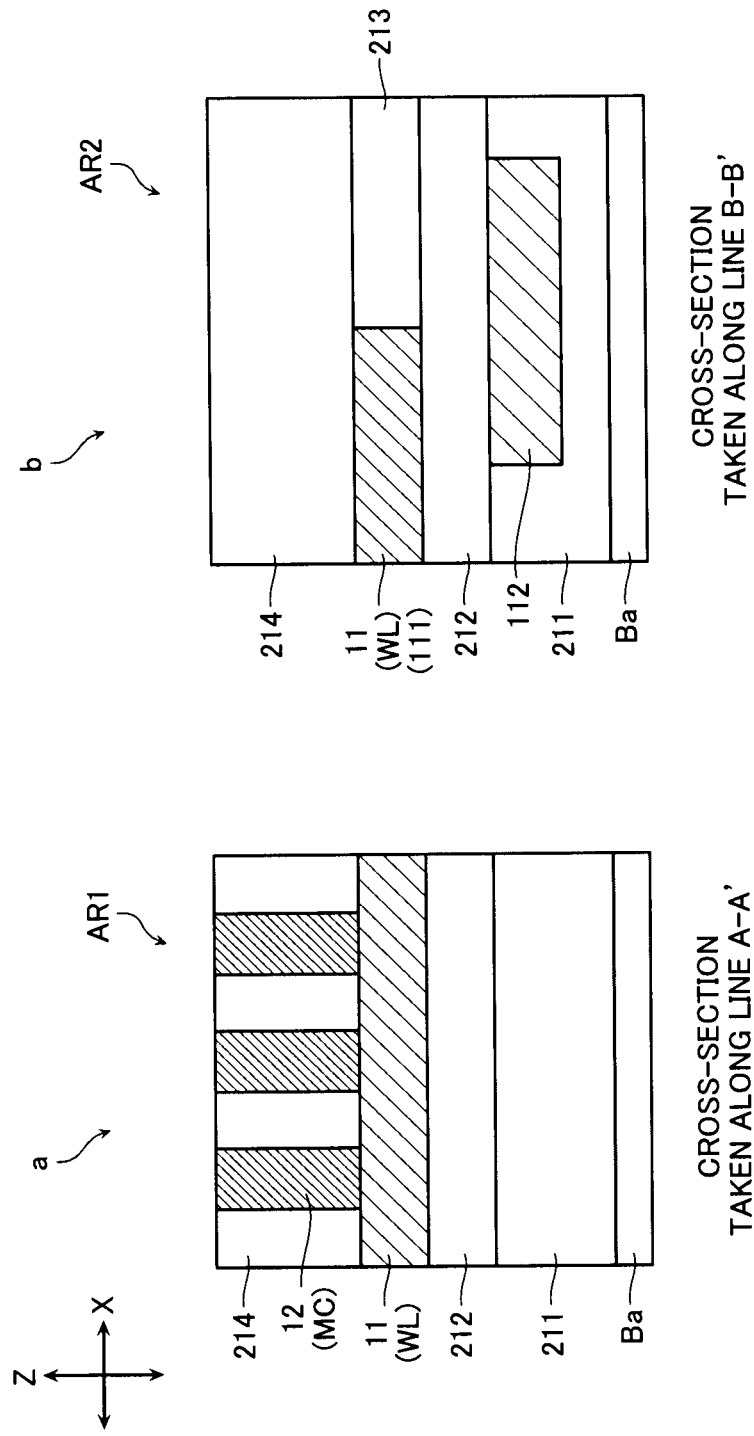
FIG. 8 shows cross-sectional views taken along lines A-A' and B-B' illustrated in FIG. 3 in the manufacturing process according to the first embodiment.

Next, as illustrated in FIG. 8, in a memory region AR1, a memory cell layer 12 is formed on the upper face of the first wiring 11 in the shape of a column. Thereafter, the interlayer insulating layer 214 is formed so as to bury the memory cell layer 12 and the first wiring 11, and a CMP process is performed.

Figure 9:
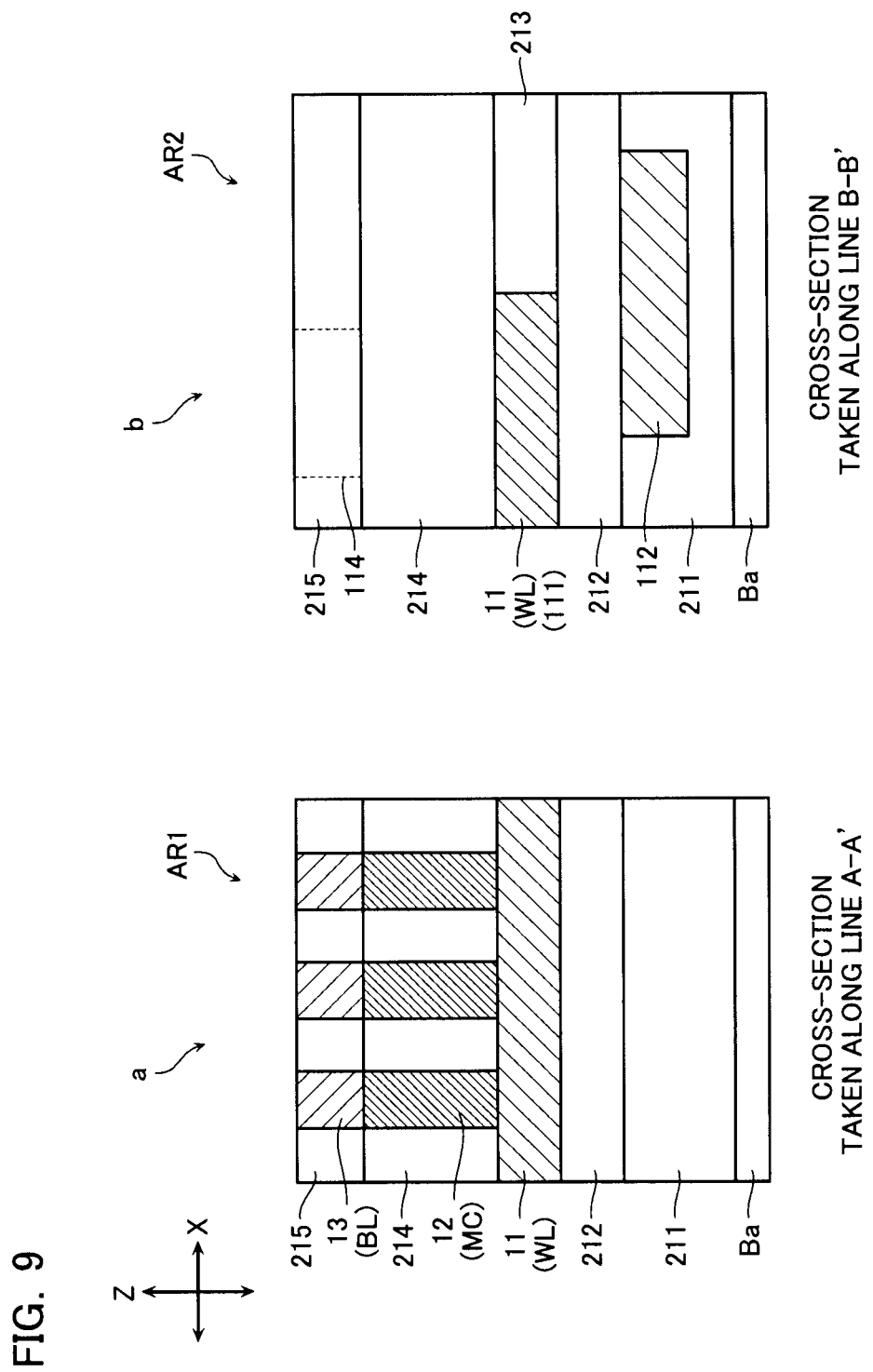
FIG. 9 shows cross-sectional views taken along lines A-A' and B-B' illustrated in FIG. 3 in the manufacturing process according to the first embodiment.

Subsequently, as illustrated in FIG. 9, in the memory region AR1, a second wiring 13 is formed and processed on the upper face of the memory cell layer 12, and in a peripheral region AR2, an etching suppressing portion 114 (the etching suppressing layer 114a) is formed in the same layer as that of the second wiring 13. In addition, after an interlayer insulating layer 215 is formed to bury the second wiring 13 and the etching suppressing portion 114, a CMP process is performed. Here, in the processing of the second wiring 13, for example, similarly to the first wiring 11, a side-wall transfer process is used, whereby the shape of the second conductive layer 13 can be finely formed.

Next, as illustrated in FIG. 10, an interlayer insulating layer 216 is formed, and, in the peripheral region AR2, the interlayer insulating layers 216 to 212 are etched through the etching suppressing portion 114, whereby a contact hole H1' is formed. Here, a region R1 in which the etching suppressing portion 114 is formed partially overlaps a region R2 in which the contact hole H1' is formed and suppresses the etching process. Accordingly, in the interlayer insulating layers 214 and 215 that are in the range of a slit S formed between portions of the etching suppressing layer 114a, the etching speed becomes lower than that in the other areas. Therefore, when the etching process advances further, as illustrated in FIG. 11, the upper face and the side face of the first wiring 11 are exposed, and a contact hole H1 is formed which reaches up to the upper face of the lower electrode layer 112. Thereafter, a barrier metal layer 113a and a metal layer 113b are buried in the contact hole H1, whereby a contact layer 111 is formed.

<Comparison>

Figure 12:
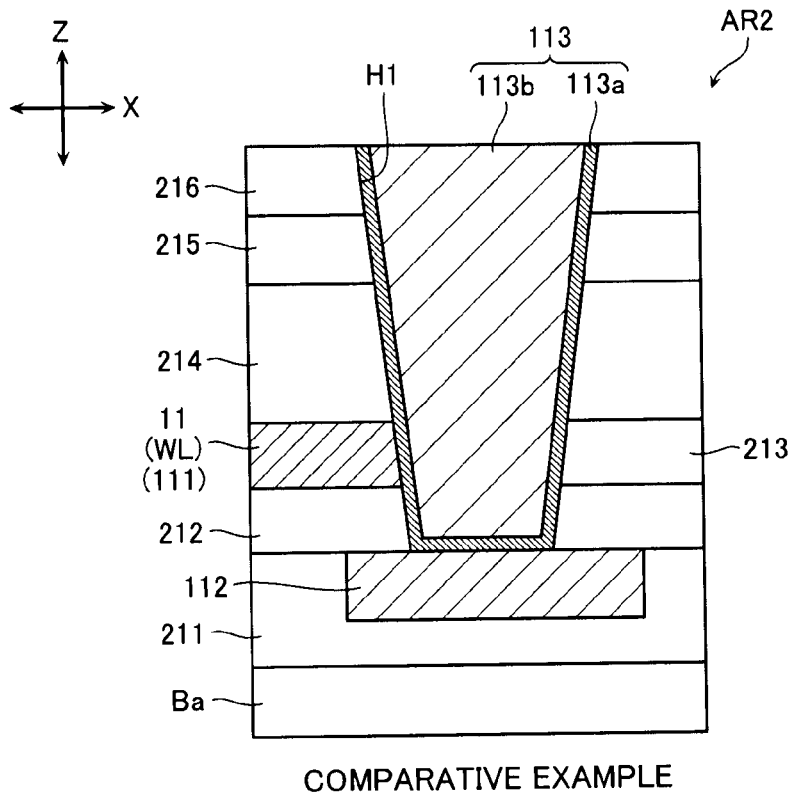
FIG. 12 shows a cross-sectional view of a semiconductor memory device according to a comparative example.

Next, for the description of the advantages of this embodiment, a comparative example and the first embodiment will be compared to each other with reference to FIG. 12. FIG. 12 shows a cross-sectional view of a semiconductor memory device according to the comparative example. In the comparative example, as illustrated in FIG. 12, the etching suppressing portion 114 is not included. Accordingly, when a contact hole H1 is formed similarly to the first embodiment, interlayer insulating layers 212 to 216 are etched over the whole contact hole H1 at a constant speed. Accordingly, the contact hole H1 is formed so as to pass through the first wiring 11 and expose only the side face of the first wiring 11. Therefore, the contact layer 113 is formed to be brought into contact with only the side face of the first wiring 11.

In contrast to this, the first embodiment includes the etching suppressing portion 114, and the first wiring 11 (the connection portion 111) is prevented from being excessively removed owing to the etching suppressing portion 114, whereby the contact hole H1 can be formed so as to expose the upper face and the side face of the first wiring 11. Accordingly, the contact layer 113 is formed to be brought into contact with the side face and the upper face of the first wiring 11. As a result, according to the first embodiment, contact resistance between the first wiring 11 and the contact layer 113 can be suppressed to be lower than that of the comparative example.

[Second Embodiment]
<Configuration>

Figure 13:
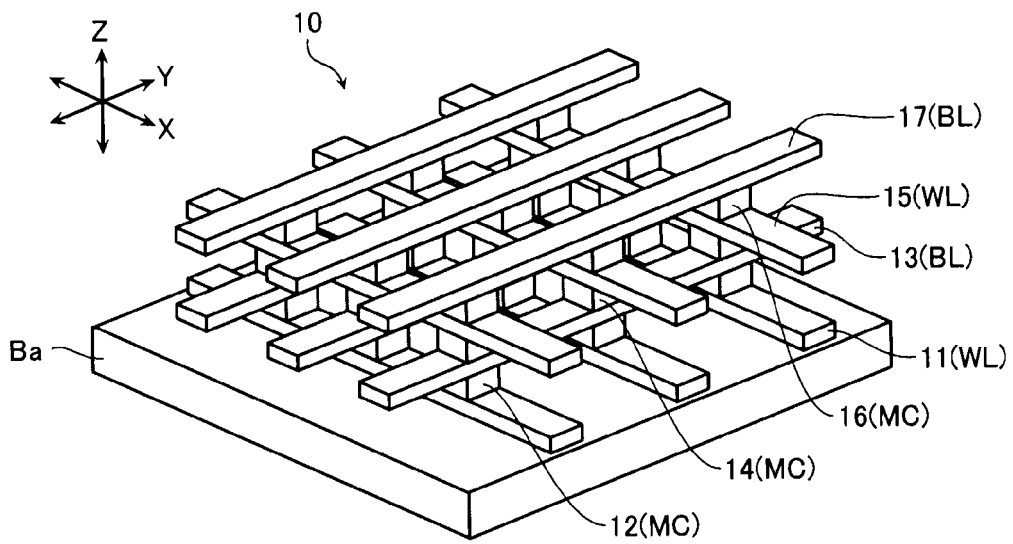
FIG. 13 shows a perspective view illustrating a memory cell array 10 according to a second embodiment.

Next, the stacking structure of a memory cell array 10 according to a second embodiment will be described in detail with reference to FIG. 13. FIG. 13 is a perspective view illustrating the memory cell array 10 according to the second embodiment.

In this embodiment, the memory cell layer has a three-layer stacking structure. In other words, the memory cell array 10, as illustrated in FIG. 13, includes a memory cell layer 14, a third wiring 15, a memory cell layer 16, and a fourth wiring 17 above the second wiring 13 from the lower layer to the upper layer, in addition to the configuration of the first embodiment. The third wiring 15 serves as the word line WL, and a fourth conductive layer 16 serves as the bit line BL.

Figure 14:
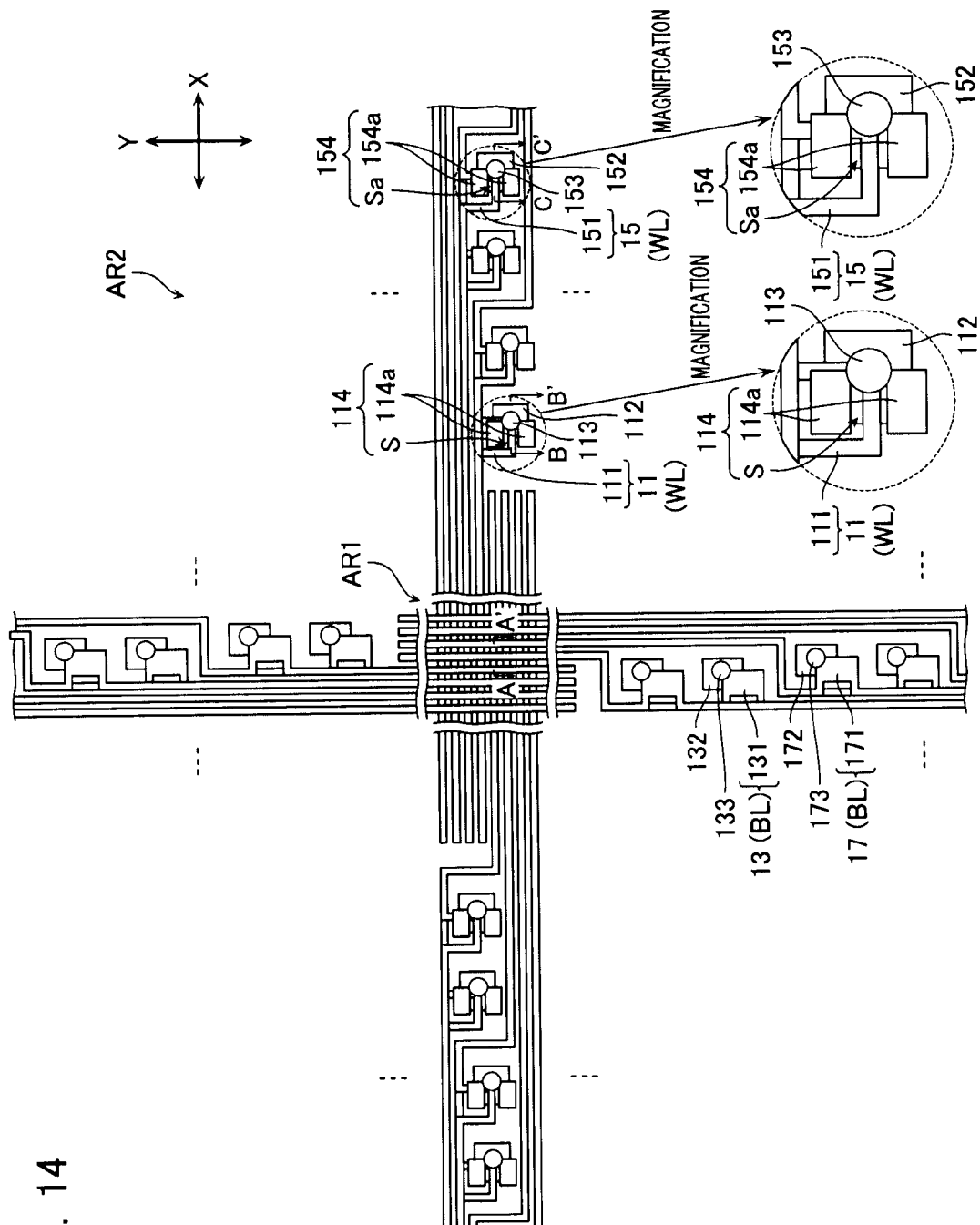
FIG. 14 shows a plan view of the semiconductor memory device according to the second embodiment.
Figure 15:
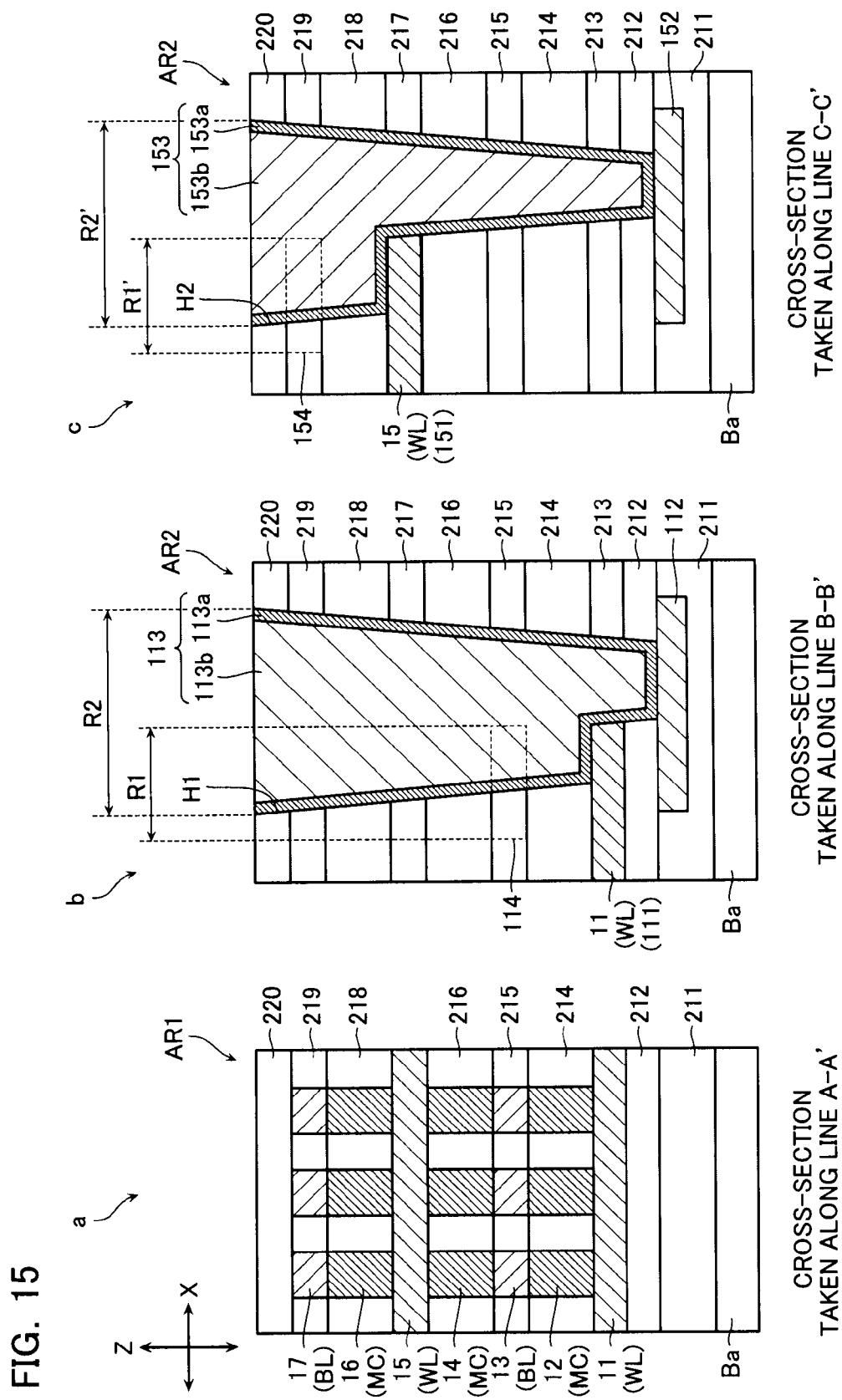
FIG. 15 shows cross-sectional views taken along lines A-A', B-B', and C-C' illustrated in FIG. 14.
Figure 16:
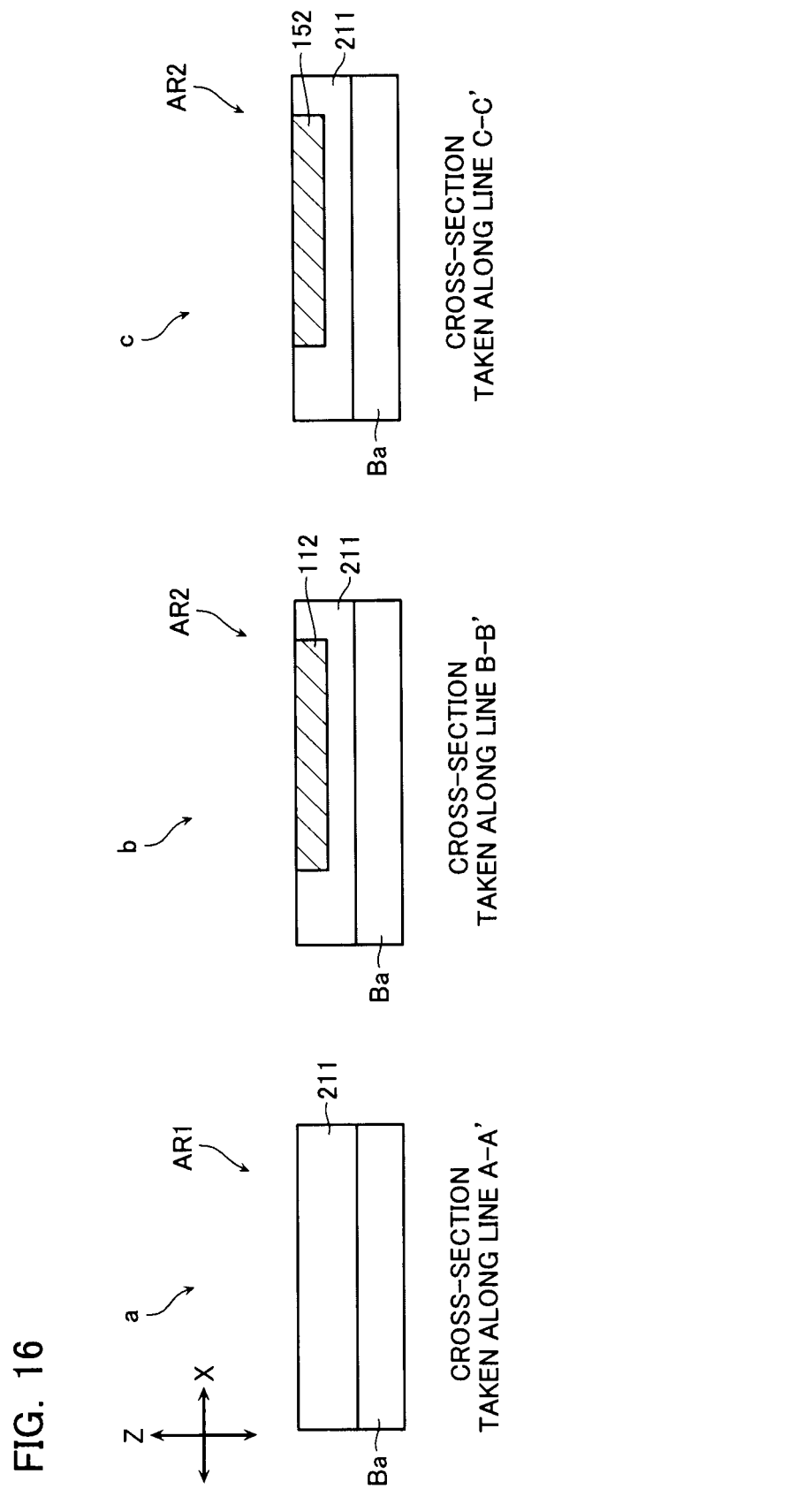
FIG. 16 shows cross-sectional views taken along lines A-A', B-B', and C-C' illustrated in FIG. 14 in a manufacturing process according to the second embodiment.
Figure 17:
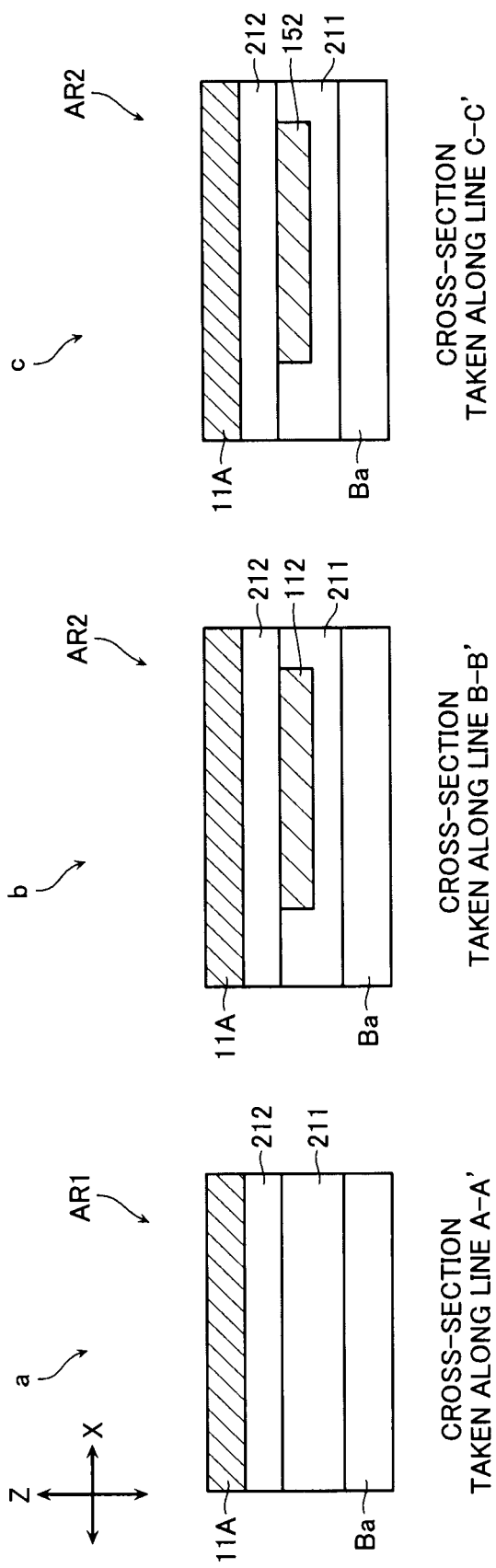
FIG. 17 shows cross-sectional views taken along lines A-A', B-B', and C-C' illustrated in FIG. 14 in the manufacturing process according to the second embodiment.
Figure 18:
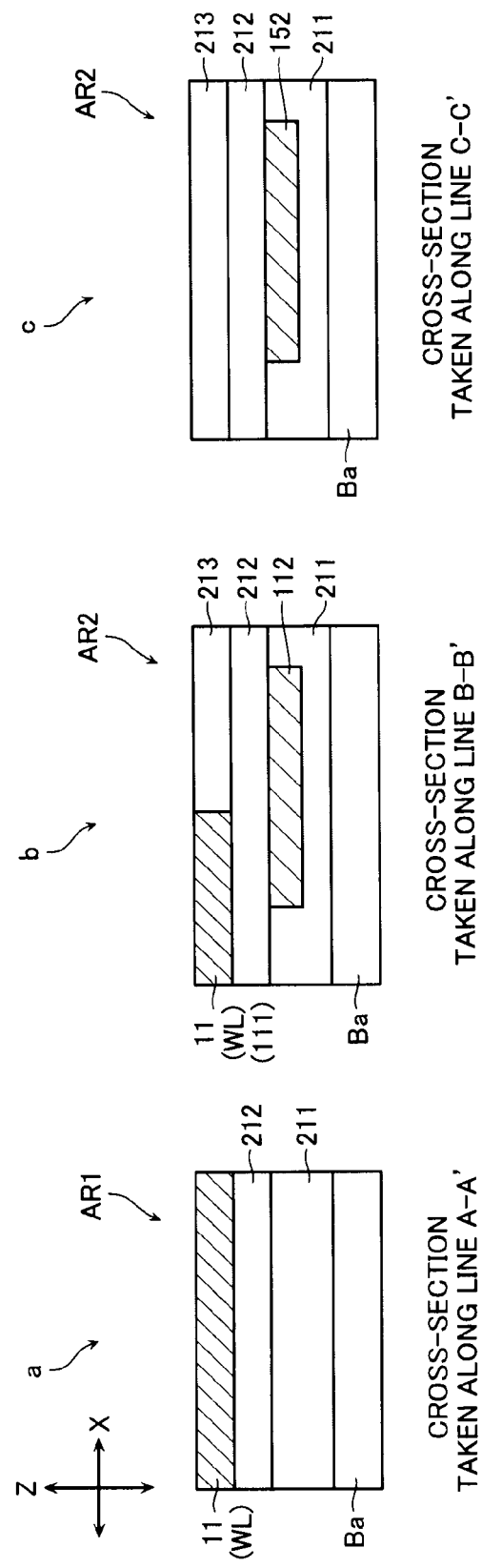
FIG. 18 shows cross-sectional views taken along lines A-A', B-B', and C-C' illustrated in FIG. 14 in the manufacturing process according to the second embodiment.
Figure 19:
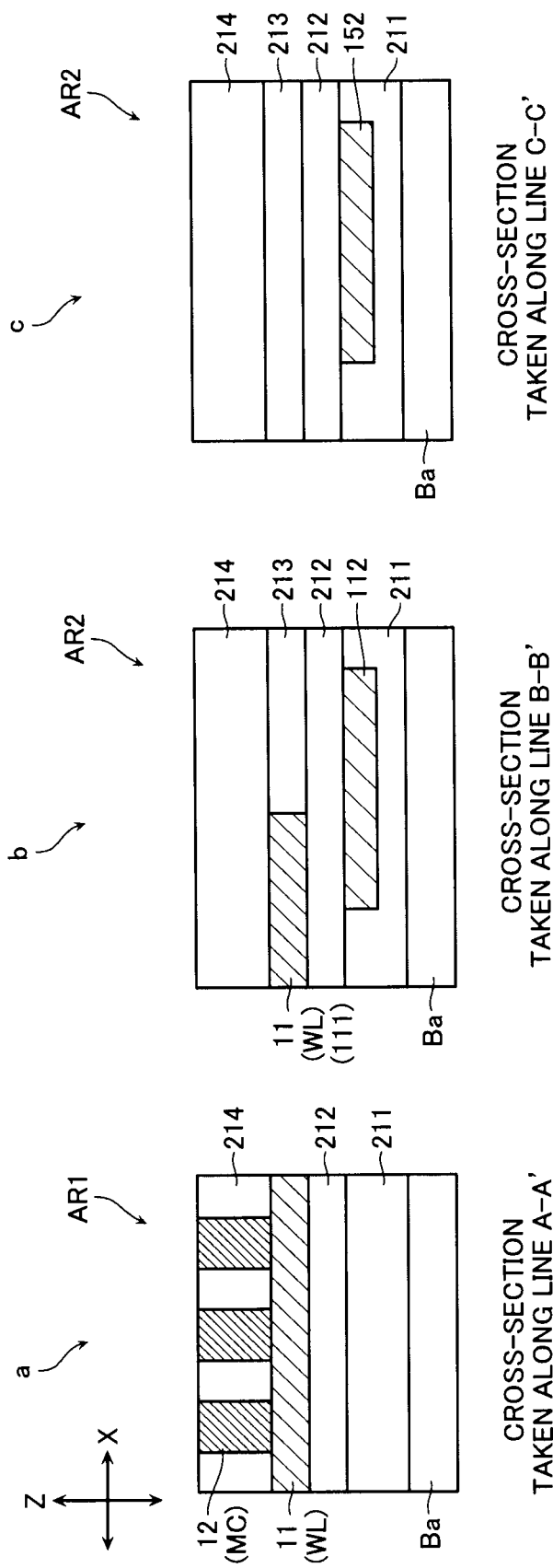
FIG. 19 shows cross-sectional views taken along lines A-A', B-B', and C-C' illustrated in FIG. 14 in the manufacturing process according to the second embodiment.
Figure 20:
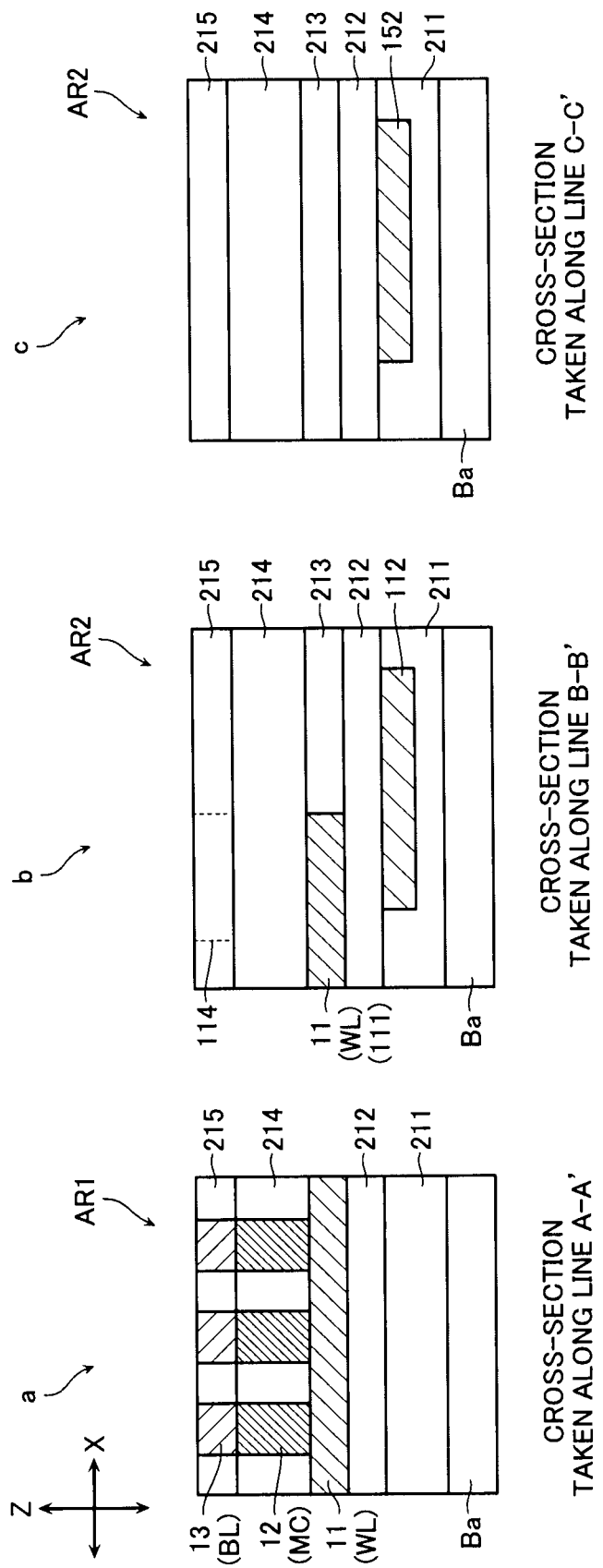
FIG. 20 shows cross-sectional views taken along lines A-A', B-B', and C-C' illustrated in FIG. 14 in the manufacturing process according to the second embodiment.

Next, the stacking structure of the semiconductor memory device according to the second embodiment will be described with reference to FIGS. 14 and 15. FIG. 14 shows a plan view of the semiconductor memory device according to the second embodiment. FIG. 15 shows cross-sectional views taken along lines A-A', B-B', and C-C' illustrated in FIG. 14.

The semiconductor memory device according to the second embodiment includes a contact layer 153 that connects the third wiring 15 and a lower electrode layer 152 in a peripheral region AR2, in addition to a contact layer 113 that connects a first wiring 11 and a lower electrode layer 112. The lower electrode layer 152 is a contact portion that is formed within an insulating layer 211 formed on a substrate Ba and is connected to a control circuit.

As illustrated in FIG. 14, the third wiring 15 includes a partially curved part as a connection portion 151 that is located above the lower electrode 152 so as to cover and overlap a part of the lower electrode 152 in the peripheral region AR2. The connection portion 151 is electrically connected to the lower electrode layer 152 located in the same layer as the lower electrode layer 112 through the contact layer 153. Here, the width of the connection portion 151 is almost the same as that of the other portion of the first wiring 11. The connection portion 151 is formed in an area different from the area of the connection portion 111 when viewed from the upper face.

The contact layer 153, as illustrated in "c" of FIG. 15, extends in the vertical direction toward the lower electrode layer 152 to be brought into contact with the side face and the upper face of the third wiring 15 (the connection portion 151) and the upper face of the lower electrode layer 152. In other words, the contact layer 153 is configured by a barrier metal layer 153a and a metal layer 153b having predetermined thicknesses filling a contact hole H2 that exposes the side face and the upper face of the third wiring 15 (the connection portion 151) and the lower electrode layer 152.

Above the connection portion 151 (in the same layer as that of the fourth wiring 17), as illustrated in FIGS. 14 and 15, an etching suppressing portion 154 is arranged. The etching suppressing portion 154, similarly to the etching suppressing portion 114, includes etching suppressing layers 154a that are formed through a slit Sa above both side of the connection portion 151 of the third wiring 15.

<Manufacturing Method>

Next, a method of manufacturing the semiconductor memory device according to the second embodiment will be described with reference to FIGS. 16 to 25. FIGS. 16 to 25 show cross-sectional views taken along lines A-A', B-B', and C-C' illustrated in FIG. 14 in the manufacturing process.

Figure 21:
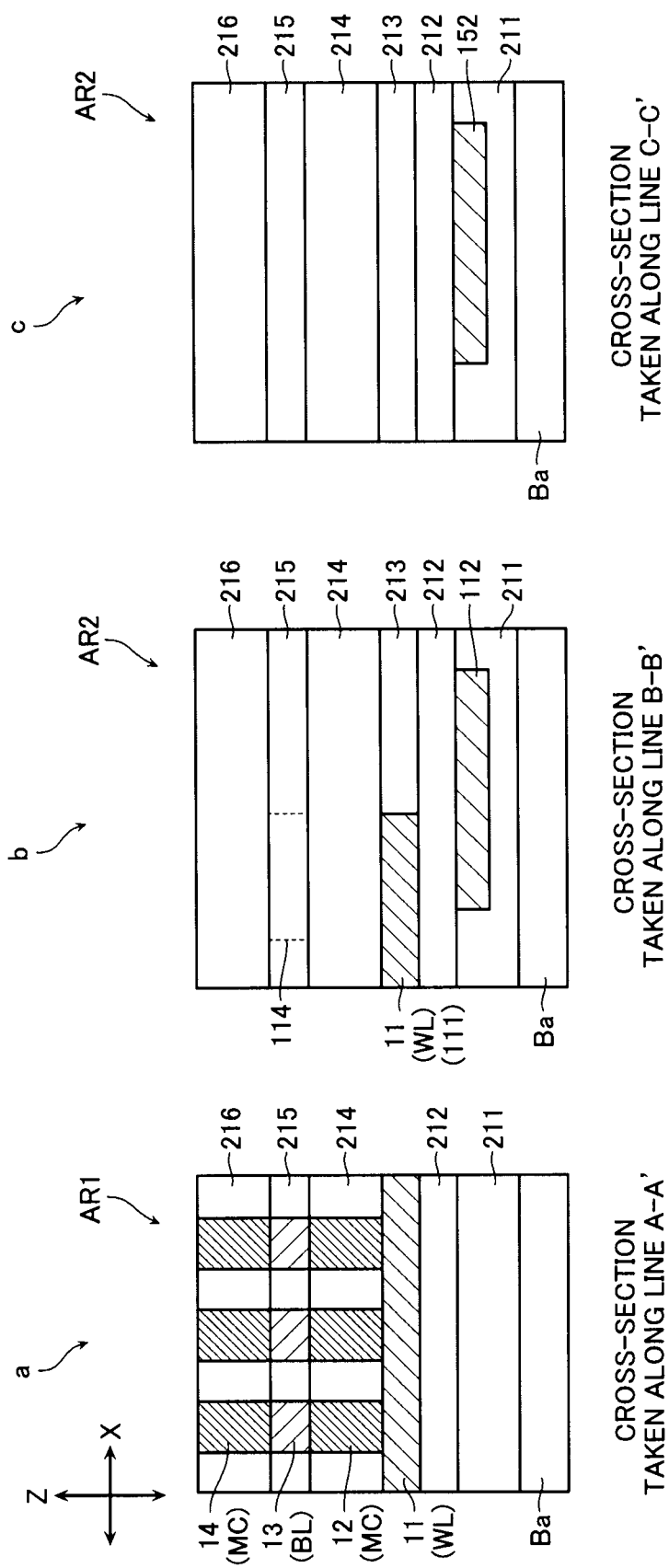
FIG. 21 shows cross-sectional views taken along lines A-A', B-B', and C-C' illustrated in FIG. 14 in the manufacturing process according to the second embodiment.

First, as illustrated in FIGS. 16 to 20, a manufacturing process is performed which is approximately the same as that of the first embodiment illustrated in FIGS. 5 to 9. Next, as illustrated in FIG. 21, the memory cell layer 14 is formed on the upper face of the second wiring 13 in the memory region AR1. In addition, after the interlayer insulating layer 216 is formed so as to bury the memory cell layer 14, a CMP process is performed.

Figure 22:
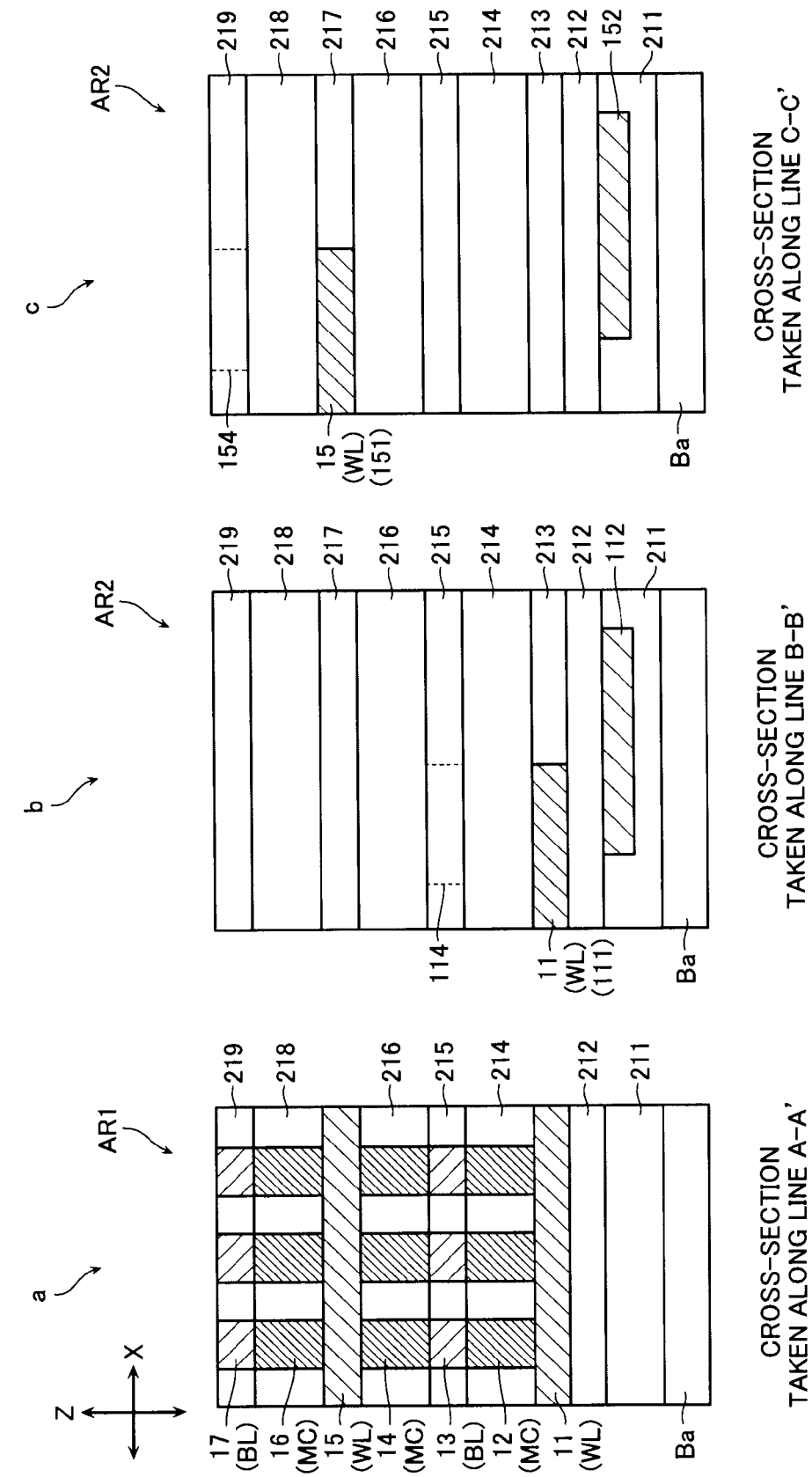
FIG. 22 shows cross-sectional views taken along lines A-A', B-B', and C-C' illustrated in FIG. 14 in the manufacturing process according to the second embodiment.

Subsequently, as illustrated in FIG. 22, in the memory region AR1, a third wiring 15, a memory cell layer 16, and a fourth wiring 17 are formed above the memory cell layer 14, and, in the peripheral region AR2, an etching suppressing portion 154 (the etching suppressing layer 154a) is formed in the same layer as that of the fourth wiring 17. In addition, interlayer insulating layers 217, 218, and 219 are formed to bury the above-described formed elements in the memory region AR1 and the peripheral region AR2. Here, the third wiring 15 and the fourth wiring 17, for example, similarly to the first wiring 11 and the second wiring 13, are processed by using a side-wall transfer process. In addition, the etching suppressing layer 154a is formed by using the same material as that of the fourth wiring 17.

Figure 23:
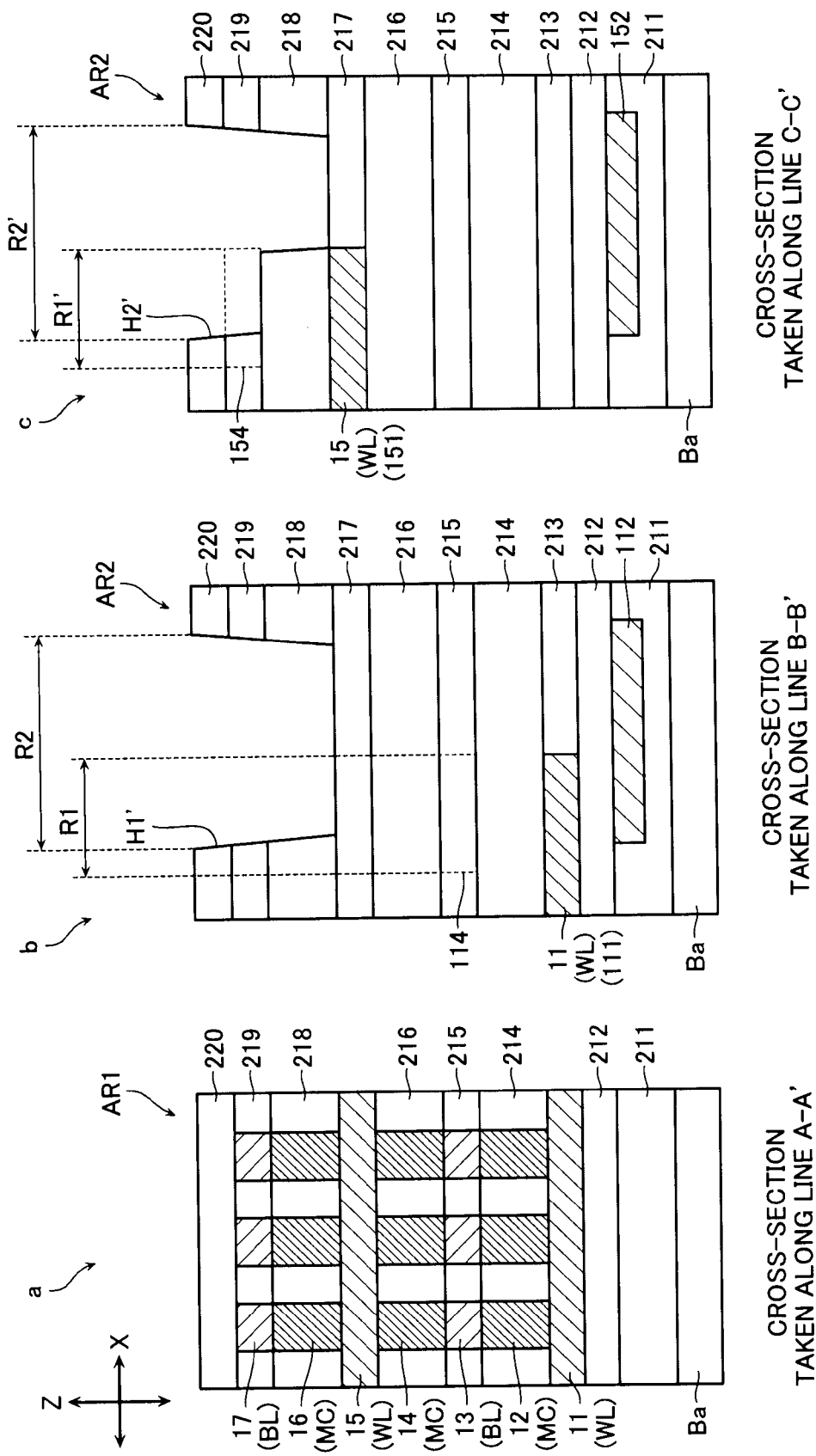
FIG. 23 shows cross-sectional views taken along lines A-A', B-B', and C-C' illustrated in FIG. 14 in the manufacturing process according to the second embodiment.
Figure 24:
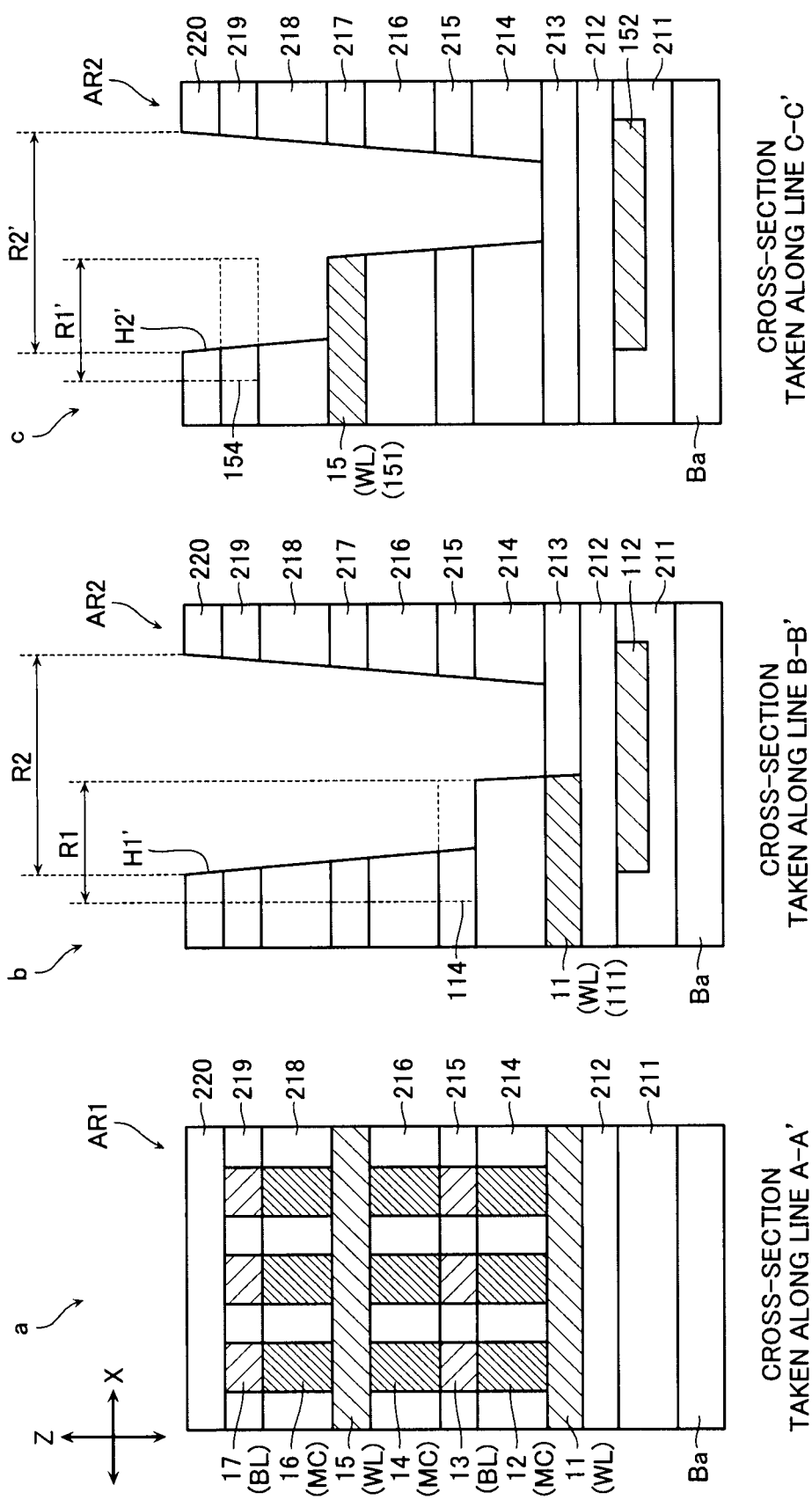
FIG. 24 shows cross-sectional views taken along lines A-A', B-B', and C-C' illustrated in FIG. 14 in the manufacturing process according to the second embodiment.
Figure 25:
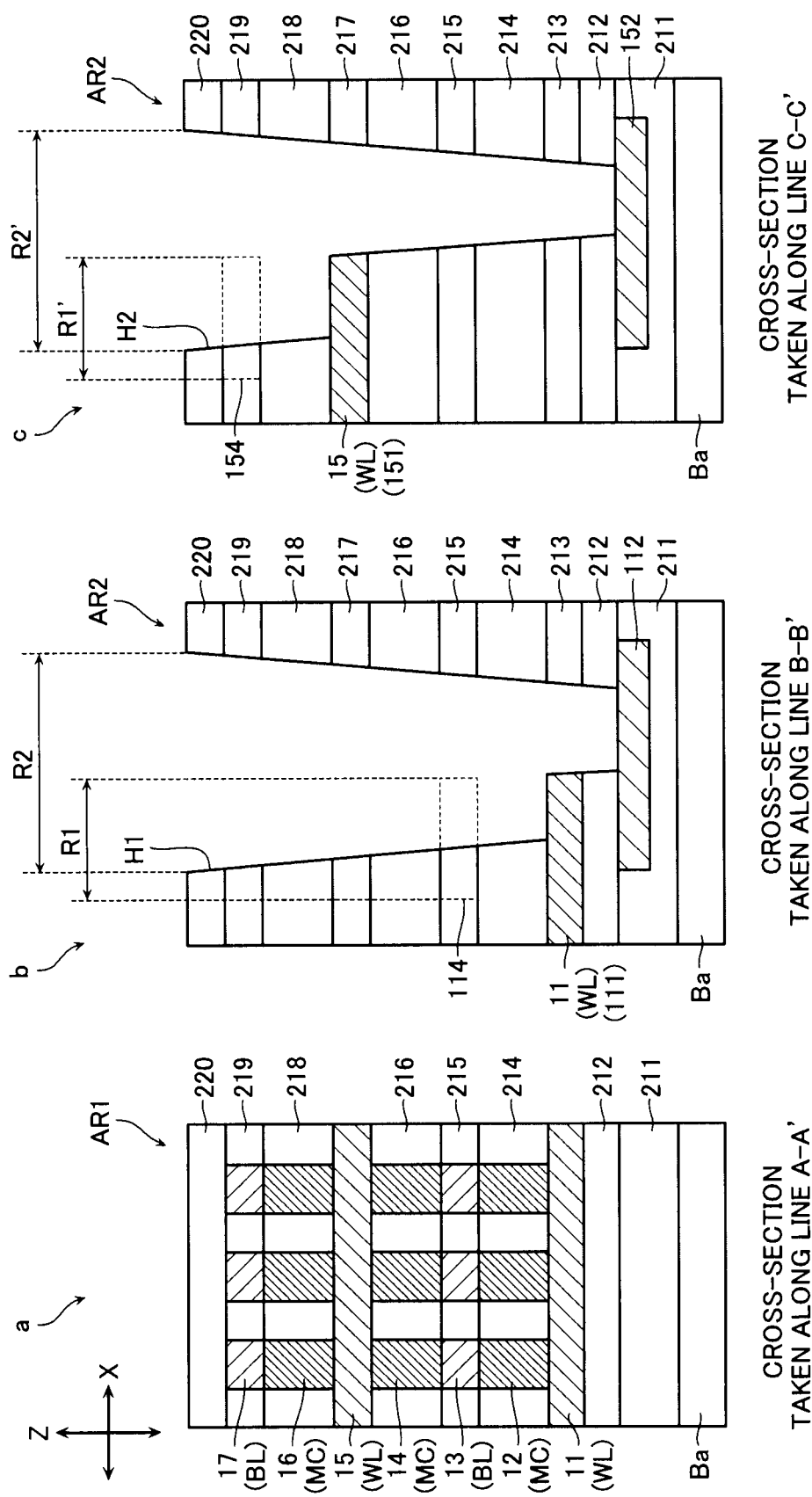
FIG. 25 shows cross-sectional views taken along lines A-A', B-B', and C-C' illustrated in FIG. 14 in the manufacturing process according to the second embodiment.

Next, as illustrated in FIG. 23, after an interlayer insulating layer 220 is formed, contact holes H1' and H2' are formed. The contact hole H2' is formed by etching the interlayer insulating layer 21 through the etching suppressing portion 154 in the peripheral region AR2. Accordingly, similarly to the above-described embodiment, the etching speed becomes lower in a region R1' in which etching is regulated by the etching suppressing portion 154 than in the other region R2'. Therefore, when the etching process advances further, as illustrated in FIGS. 24 and 25, the contact hole H2' exposes the upper face and the side face of the third wiring 15 so as to be formed as a contact hole H2 that reaches up to the upper face of the lower electrode layer 152. Thereafter, the barrier metal layer 153a and the metal layer 153b are buried in the contact hole H2, whereby a contact layer 153 is formed.

According to the configuration and the manufacturing method described above, in the second embodiment, advantages similar to those of the first embodiment are acquired.

[Third Embodiment]
<Configuration>

Figure 26:
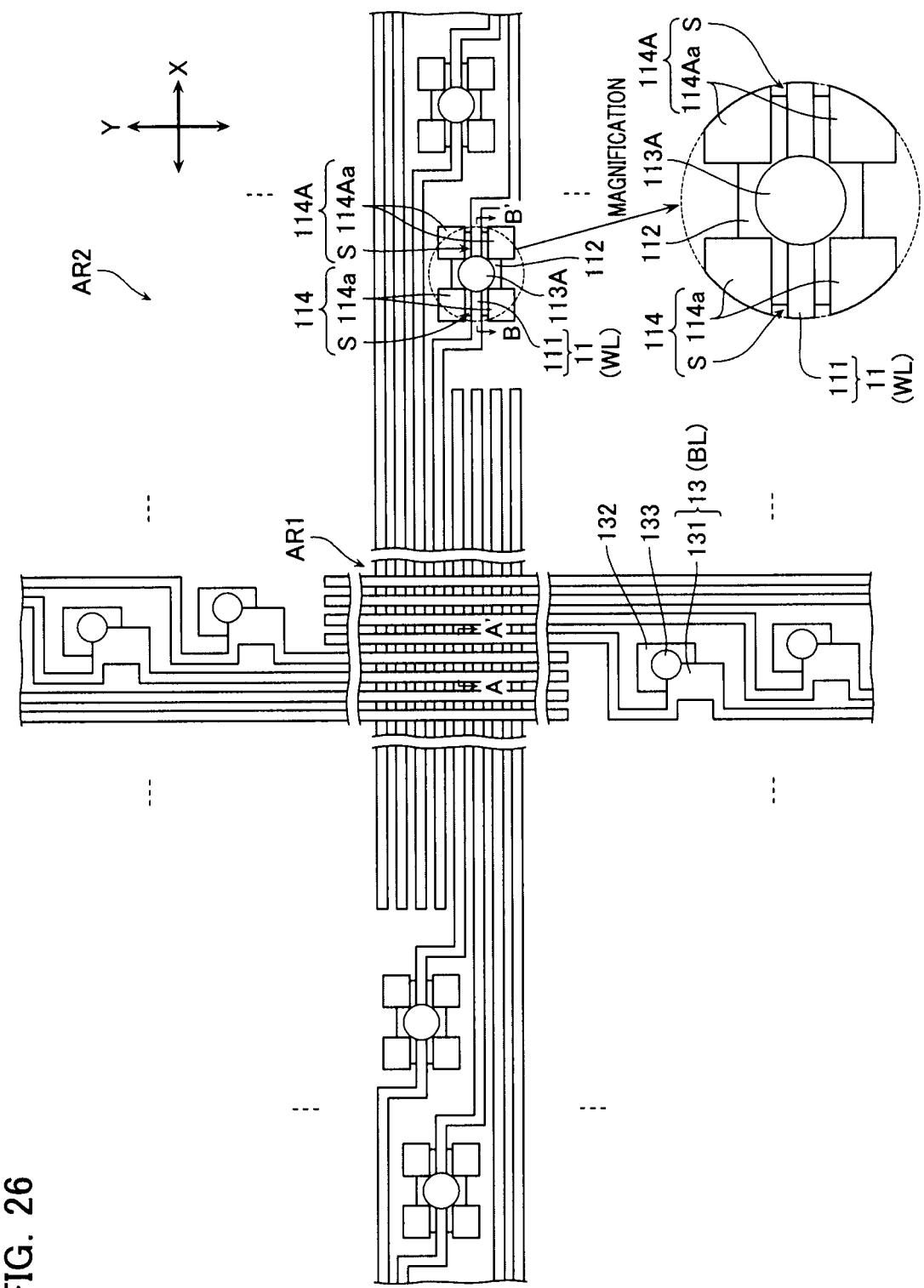
FIG. 26 shows a plan view of a semiconductor memory device according to a third embodiment.
Figure 27:
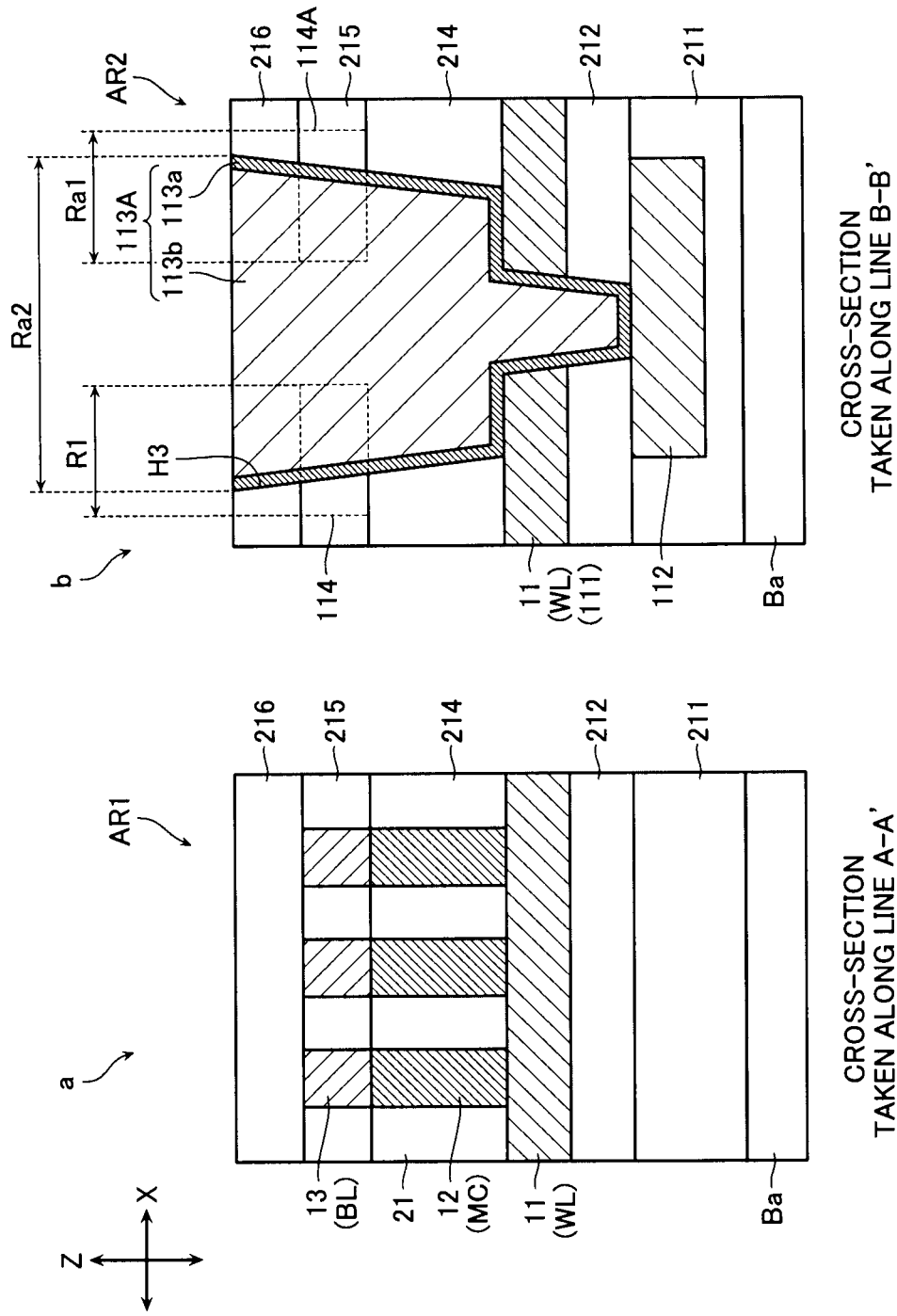
FIG. 27 shows cross-sectional views taken along lines A-A' and B-B' illustrated in FIG. 26.

Next, the stacking structure of a semiconductor memory device according to a third embodiment will be described with reference to FIGS. 26 and 27. FIG. 26 shows a plan view of the semiconductor memory device according to the third embodiment. FIGS. 27 shows cross-sectional views taken along lines A-A' and B-B' illustrated in FIG. 26. Since the structure of a memory cell array 10 according to the third embodiment is similar to that of the first embodiment, the description thereof will be omitted here.

In the semiconductor memory device according to the third embodiment, as illustrated in "b" of FIG. 27, a contact layer 113A is brought into contact with the side face and the upper face of the first wiring 11 (the connection portion 111) on both side faces in the X direction (a direction in which the word line WL extends), which is different from the first and second embodiments.

Accordingly, in the third embodiment, in addition to the etching suppressing portion 114, an etching suppressing portion 114A is included in the same layer. The first wiring 11 is formed so as to transect the upper portion of the lower electrode layer 112 in the X direction. The etching suppressing portions 114 and 114A are formed so as to protrude from both sides by R1 and Ra1 in the X direction in the region Rat in which the contact hole H3 is formed and are formed such that the upper portion of the first wiring 11 is formed as a slit S. Both the etching suppressing portions 114 and 114A regulate the etching process. In addition, the etching suppressing portion 114A includes an etching suppressing layer 114Aa formed on both ends thereof through the slit S.

<Manufacturing Method>

Next, a method of manufacturing the semiconductor memory device according to the third embodiment will be described with reference to FIGS. 28 to 32. FIGS. 28 to 32 show cross-sectional views taken along lines A-A' and B-B' illustrated in FIG. 27 in the manufacturing process.

Figure 28:
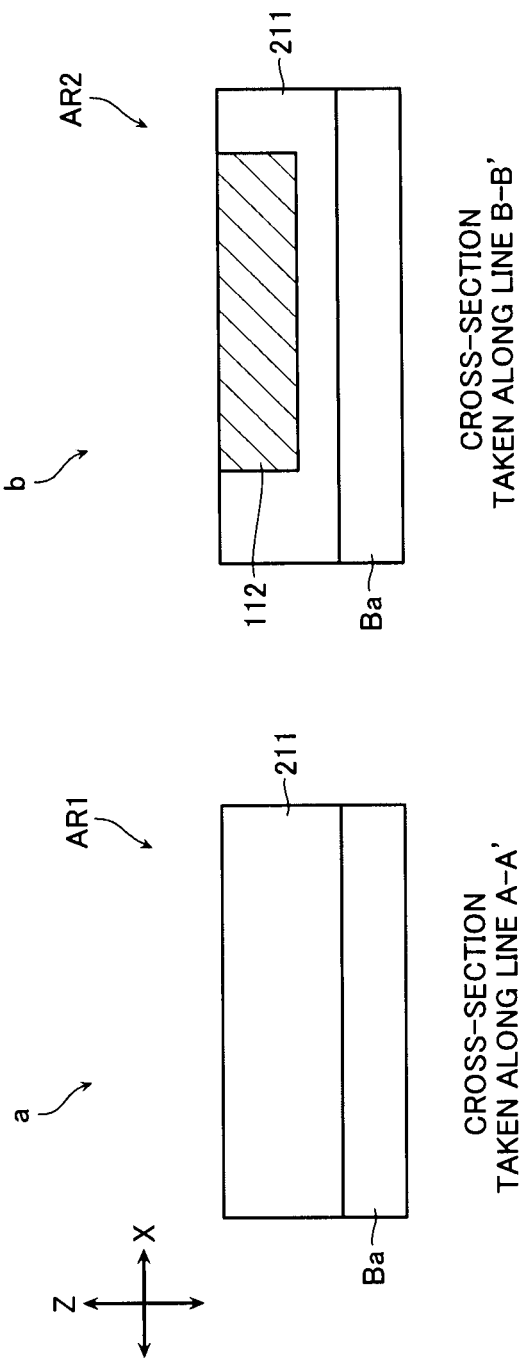
FIG. 28 shows cross-sectional views taken along lines A-A' and B-B' illustrated in FIG. 26 in a manufacturing process according to the third embodiment.
Figure 29:
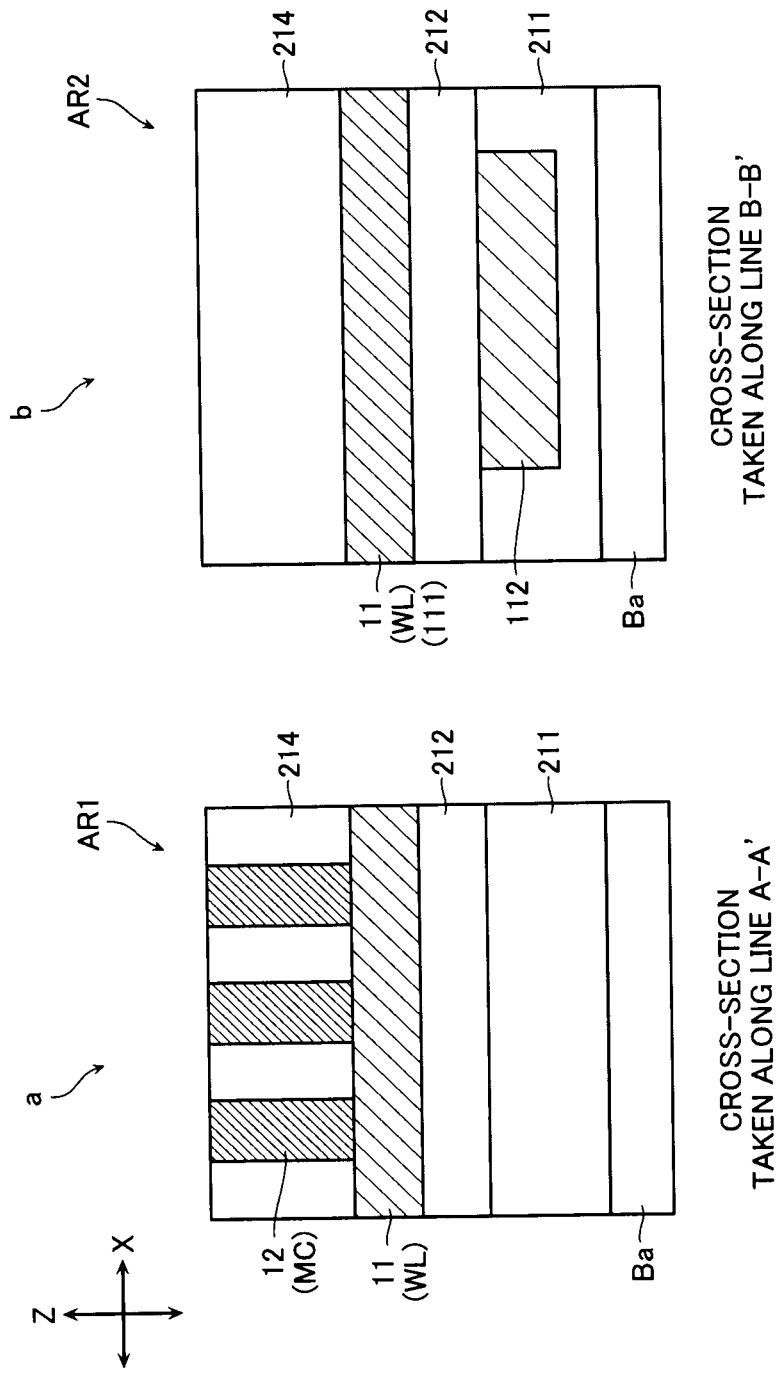
FIG. 29 shows cross-sectional views taken along lines A-A' and B-B' illustrated in FIG. 26 in the manufacturing process according to the third embodiment.
Figure 30:
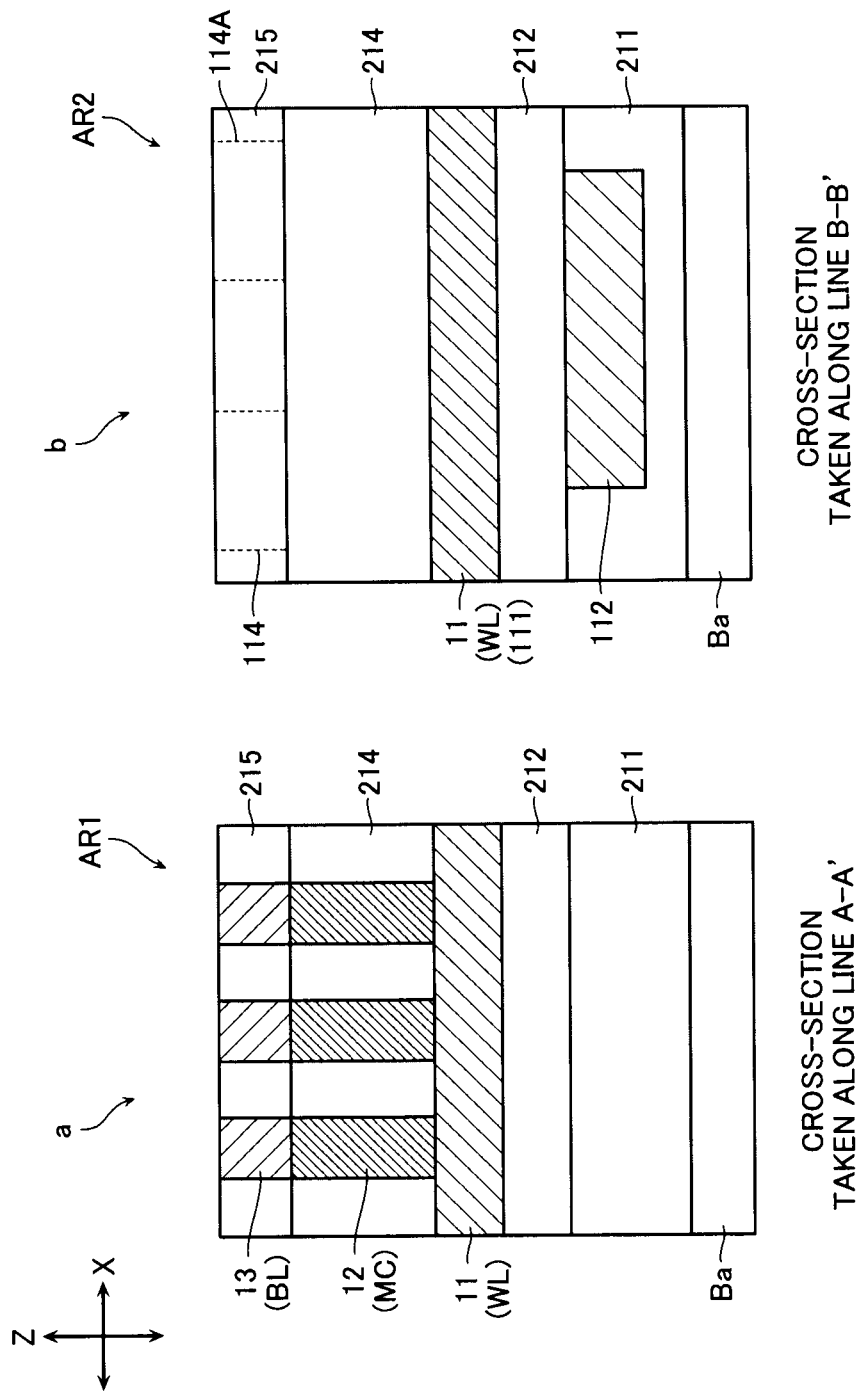
FIG. 30 shows cross-sectional views taken along lines A-A' and B-B' illustrated in FIG. 26 in the manufacturing process according to the third embodiment.

First, as illustrated in FIGS. 28 and 29, a manufacturing process is performed which is approximately the same as that of the first embodiment illustrated in FIGS. 5 to 8. Subsequently, as illustrated in FIG. 30, a second wiring 13 is formed in a memory region AR1, and etching suppressing portions 114 and 114A are formed in a peripheral region AR2. In addition, after interlayer insulating layers 214 and 215 are formed so as to bury the second wiring 13 and the etching suppressing portions 114 and 114A, a CMP process is performed.

Figure 31:
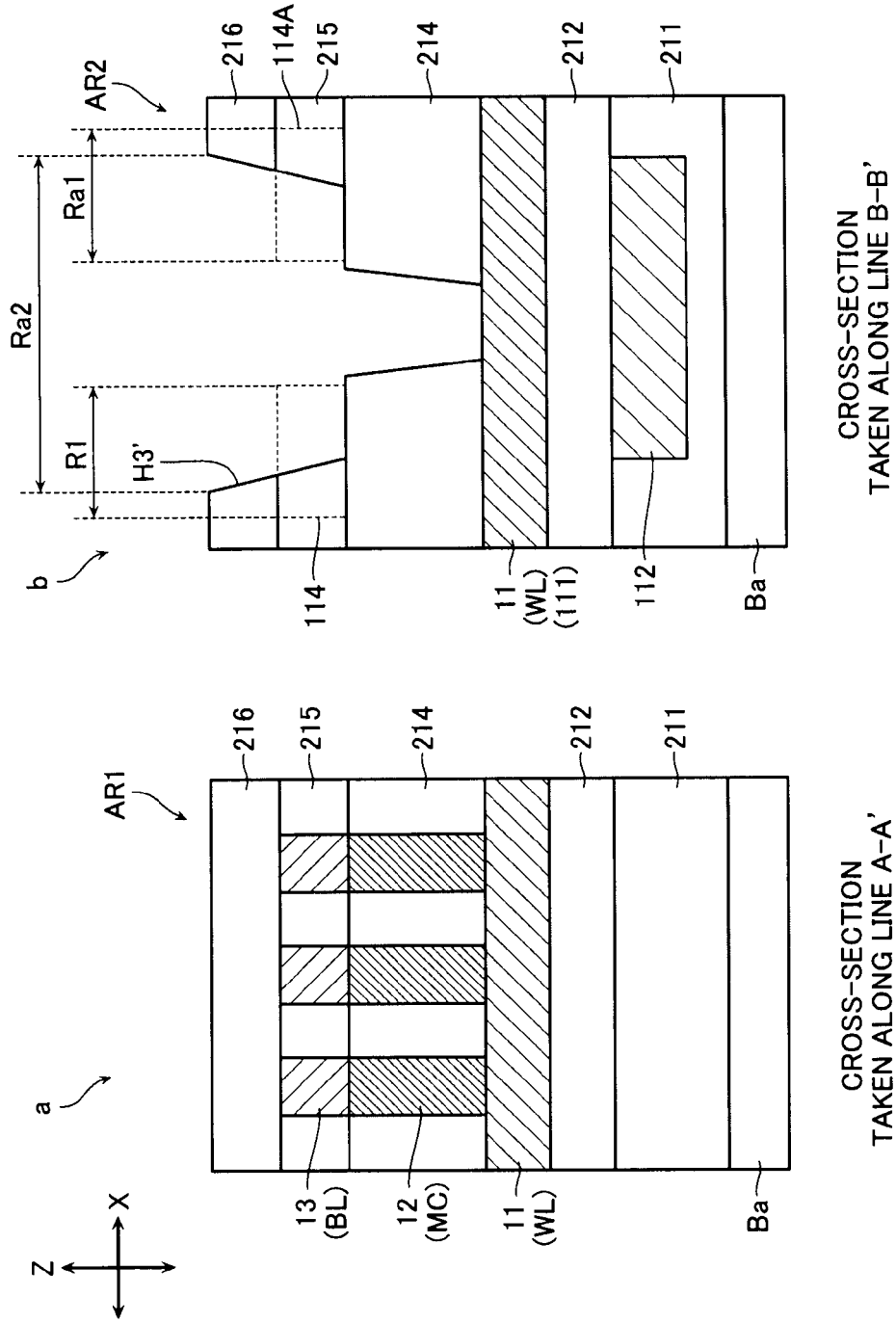
FIG. 31 shows cross-sectional views taken along lines A-A' and B-B' illustrated in FIG. 26 in the manufacturing process according to the third embodiment.
Figure 32:
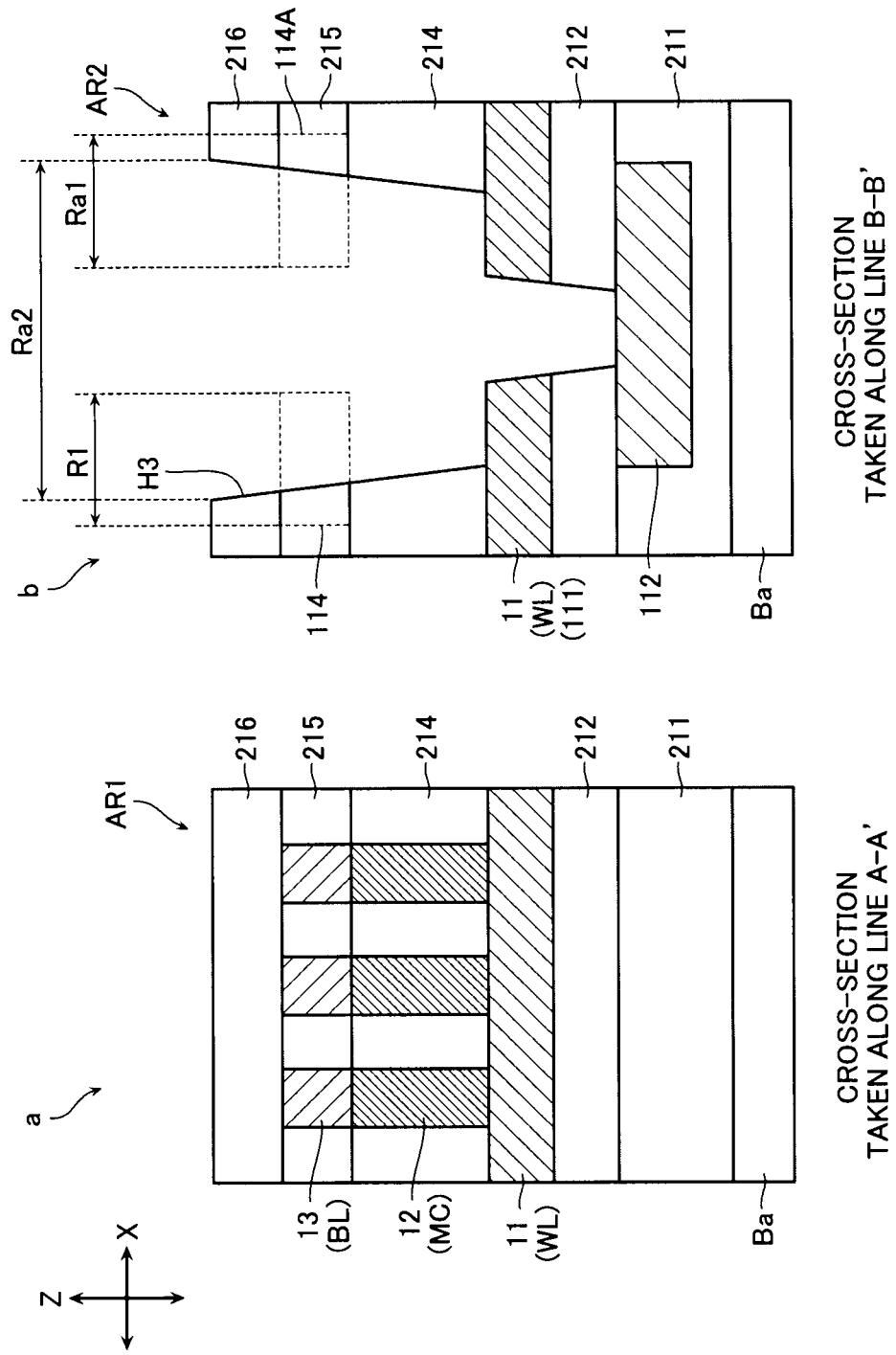
FIG. 32 shows cross-sectional views taken along lines A-A' and B-B' illustrated in FIG. 26 in the manufacturing process according to the third embodiment.

Next, as illustrated in FIG. 31, in the peripheral region AR2, interlayer insulating layers 216, 215, and 214 are etched through the etching suppressing portions 114 and 114A, whereby a contact hole H3' is formed. Here, since the etching suppressing portions 114 and 114A suppress the etching process, the etching speed for the interlayer insulating layer 21 in a suppressed area becomes lower than that in the other area. Therefore, when the etching process advances further, as illustrated in FIG. 32, the contact hole H3' passes through the first wiring 11 and exposes the upper face and the side face of the first wiring 11 on both side faces in the X direction so as to be formed as a contact hole H3 that reaches up to the upper face of the lower electrode layer 112. Thereafter, a contact layer 113A is formed so as to bury the contact hole H3.

According to the configuration and the manufacturing process described above, in the third embodiment, a connection area between the first wiring and the contact layer 113 can be increased to be larger than that of the first embodiment, whereby connection resistance can be decreased.

[Fourth Embodiment]
<Configuration>

Figure 33:
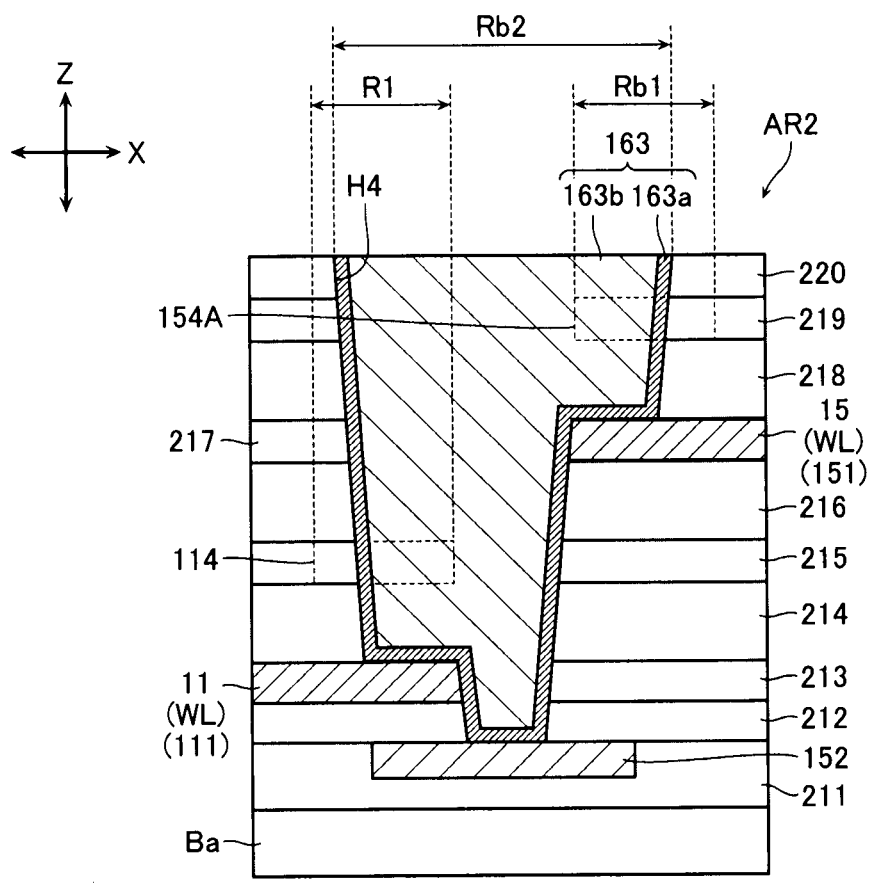
FIG. 33 shows a cross-sectional view of a semiconductor memory device according to a fourth embodiment.

Next, the stacking structure of a semiconductor memory device according to a fourth embodiment will be described with reference to FIG. 33. FIG. 33 shows a cross-sectional view of the semiconductor memory device according to the fourth embodiment. Since the structure of a memory cell array 10 according to the fourth embodiment is similar to that of the second embodiment, the description thereof will be omitted here.

In the semiconductor memory device according to the fourth embodiment, as illustrated in FIG. 33, one contact layer 163 connects other wirings, that is, a first wiring 11 and a third wiring 15 and a lower electrode layer 152, which is different from the first to third embodiments.

In this case, an etching suppressing portion 114 is formed through an insulating layer 214 of the first wiring 11, and an etching suppressing portion 154A is formed through an insulating layer 218 of the third wiring 15.

<Manufacturing Method>

Figure 34:
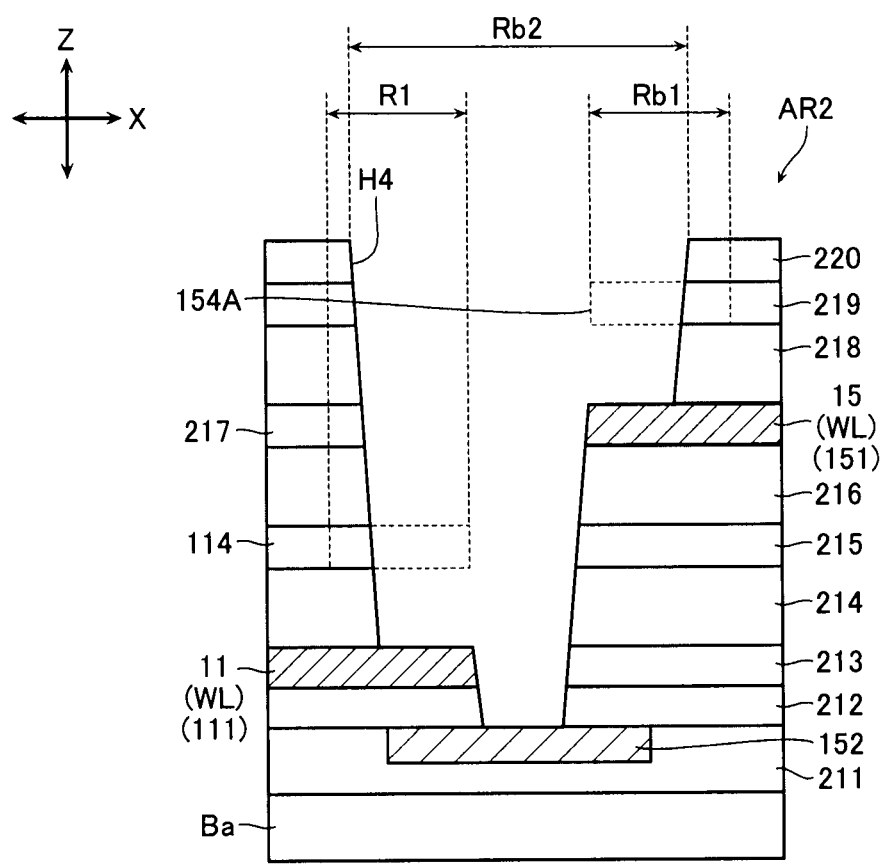
FIG. 34 shows a cross-sectional view in a manufacturing process of the fourth embodiment.

Next, a method of manufacturing the semiconductor memory device according to the fourth embodiment will be described with reference to FIG. 34. FIG. 34 shows a cross-sectional view in a manufacturing process of the fourth embodiment. In the fourth embodiment, first, a manufacturing process is performed which is approximately the same as that of the second embodiment illustrated in FIGS. 16 to 22. However, in the fourth embodiment, instead of the etching suppressing portion 154 according to the second embodiment, an etching suppressing portion 154A is formed, and the first wiring 11 and the third wiring 15 are connected to a common contact layer 163.

In addition, as illustrated in FIG. 34, in the peripheral region AR2, interlayer insulating layers 212 to 220 are etched through the etching suppressing portions 114 and 154A, whereby a contact hole H4 is formed. Here, since the heights of end portions of the contact hole H4 at the time of completion of etching on both sides in the X direction are controlled in accordance with the heights of the etching suppressing portions 114 and 154A, the contact hole H4 can be formed so as to be appropriate for the heights of the first wiring 11 and the third wiring 15.

<Other Embodiments>

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

For example, in the first embodiment described above, the contact layer 113 is connected to the lower electrode layer 112 and the first wiring 11. However, the contact layer 113 may be configured to connect the lower electrode layer 112 and the second wiring 12 (bit line BL).

In addition, for example, in the memory cell array 10 illustrated in the second embodiment described above, the second wiring 13 (bit line BL) is shared by the memory cell layers 12 and 14 that are located on the upper and lower sides thereof. However, the memory cell array 10 may be acquired by stacking the structure illustrated in FIG. 2 through the interlayer insulating layer.

What is claimed is:

1. A semiconductor memory device comprising:
    a lower circuit layer comprising a substrate and a first lower electrode layer and a second lower electrode layer located on the substrate;
    an upper circuit layer comprising a first wiring formed above the lower circuit layer and extending in a predetermined direction, a second wiring being perpendicular to the first wiring, a third wiring formed above the second wiring and extending in the predetermined direction, and memory cell layers disposed between the first wiring and the second wiring and disposed between the second wiring and the third wiring; and
    a first contact layer connecting the first lower electrode layer and the third wiring outside a memory cell array in which the memory cell layers are formed,
    a second contact layer connecting the second lower electrode layer and the first wiring outside the memory cell array,
    a first connection portion covering a part of the first lower electrode layer outside the memory cell array in a stacking direction of the first wiring and the second wiring, and formed in the third wiring, a second connection portion covering a part of the second lower electrode layer outside the memory cell array in the stacking direction, and formed in the first wiring, a first etching suppressing portion formed above the first connection portion, and a second etching suppressing portion formed at a height from the substrate which is between the first connection portion and the second lower electrode layer, the first contact layer being connected to an upper face and a side face of the first connection portion and the first lower electrode layer, and the second contact layer being connected to an upper face and a side face of the second connection portion and the second lower electrode layer.

2. The semiconductor memory device according to claim 1, wherein the second etching suppressing portion is disposed in the same layer as that of the second wiring.

3. The semiconductor memory device according to claim 1, wherein the first etching suppressing portion comprises an etching suppressing layer formed above both sides of the first connection portion, such that a portion corresponding to the first connection portion is formed as a slit.

4. The semiconductor memory device according to claim 1, wherein a plurality of memory cell array layers each including the first wirings, the second wirings and the memory cell layers are stacked, a plurality of contact layers including the first contact layer and the second contact layer, a plurality of etching suppressing portions including the first etching suppressing portion and the second etching suppressing portion and a plurality of lower electrode layers including the first lower electrode layer and a second lower electrode layer are formed, and each one of the contact layers connects one of the first wirings or one of the second wirings and one of the lower electrode layers.

5. The semiconductor memory device according to claim 1, wherein a plurality of memory cell array layers each including the first wirings, the second wirings and the memory cell layers are stacked, and the first contact layer connects the plurality of the first wirings disposed in a stacked direction or the plurality of the second wirings disposed in the stacked direction and the first lower electrode layer.

6. The semiconductor memory device according to claim 1, wherein the first contact layer passes through the first connection portion.

7. The semiconductor memory device according to claim 2, wherein the first etching suppressing portion is electrically-insulated from the second wiring.

* * * * *